United States Patent
Yamamoto et al.

(10) Patent No.: US 7,667,218 B2
(45) Date of Patent: Feb. 23, 2010

(54) SEMICONDUCTOR INTEGRATED CIRCUIT DEVICE AND METHOD OF MANUFACTURING THE SAME

(75) Inventors: Naoki Yamamoto, Kochi (JP); Norikatsu Takaura, Tokyo (JP); Yuichi Matsui, Kawasaki (JP); Nozomu Matsuzaki, Kokubunji (JP); Kenzo Kurotsuchi, Kokubunji (JP); Motoyasu Terao, Hinode (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/289,410

(22) Filed: Nov. 30, 2005

(65) Prior Publication Data
US 2006/0113520 A1 Jun. 1, 2006

(30) Foreign Application Priority Data
Dec. 1, 2004 (JP) ............................... 2004-348647

(51) Int. Cl.
*H01L 47/00* (2006.01)
*H01L 29/76* (2006.01)
*H01L 27/108* (2006.01)
*H01L 29/94* (2006.01)
*H01L 29/00* (2006.01)

(52) U.S. Cl. ...................... 257/3; 257/214; 257/298; 257/529

(58) Field of Classification Search ............ 257/2–5, 257/95, 295, 529, 42, 214, 298

See application file for complete search history.

(56) References Cited

U.S. PATENT DOCUMENTS

| | | | | |
|---|---|---|---|---|
| 4,845,533 A | | 7/1989 | Pryor et al. | 357/2 |
| 5,166,758 A | | 11/1992 | Ovshinsky et al. | 257/3 |
| 5,406,509 A | | 4/1995 | Ovshinsky et al. | 365/113 |
| 5,920,788 A | * | 7/1999 | Reinberg | 438/466 |
| 5,933,365 A | * | 8/1999 | Klersy et al. | 365/148 |
| 7,115,924 B1 | * | 10/2006 | LaMaster et al. | 257/291 |
| 7,402,851 B2 | * | 7/2008 | Hideki et al. | 257/246 |

(Continued)

FOREIGN PATENT DOCUMENTS
JP 2002-203392 7/2002

OTHER PUBLICATIONS
S. Lai et al., "OUM—A 180 nm Nonvolatile Memory Cell Element Technology For Stand Alone and Embedded Applications," IEEE IEDM Tech. Dig., 2001, pp. 803-806.

(Continued)

*Primary Examiner*—Chuong A. Luu
(74) *Attorney, Agent, or Firm*—Miles & Stockbridge P.C.

(57) ABSTRACT

Disclosed herein is a phase change memory semiconductor integrated circuit device using a chalcogenide film that solves a problem that the operation temperature capable of ensuring long time memory retention is low due to low phase change temperature is and, at the same time, a problem that power consumption of the device is high since a large current requires to rewrite memory information due to low resistance. A portion of constituent elements for a chalcogenide comprises nitride, oxide or carbide which are formed to the boundary between the chalcogenide film and a metal plug as an underlying electrode and to the grain boundary of chalcogenide crystals thereby increasing the phase change temperature and high Joule heat can be generated even by a small current by increasing the resistance of the film.

14 Claims, 9 Drawing Sheets

U.S. PATENT DOCUMENTS

2004/0251551 A1* 12/2004 Hideki .................. 257/758
2008/0144355 A1* 6/2008 Boeve et al. ............ 365/148

OTHER PUBLICATIONS

Y. C. Chen et al., "180nm Sn-Doped $Ge_2Sb_2Te_5$ Chalcogenide Phase-change Memory Devices for Low Power, High Speed Embedded Memory for SOC Applications," IEEE Custom Circuits Conference, 2003, pp. 395-398.

H. Horii et al., "A Novel Cell Technology Using N-doped GeSbTe Films for Phase Change RAM," 2003 Symposium on VLSI Technology Digest of Technical Papers, T12B-5, pp. 177-178.

R. Kojima et al., "Nitrogen Doping Effect on Phase Change Optical Disks," Jpn. J. Appl. Phys. vol. 37, Part 1, No. 4B, Apr. 1998, pp. 2098-2103.

T. H. Jeong et al., "Crystal Structure and Microstructure of Nitrogen-Doped $Ge_2Sb_2Te_5$ Thin Film," Jpn. J. Appl. Phys. vol. 39, Part 1, No. 5A, May 2000, pp. 2775-2779.

A. Ebina et al., "Oxygen doping effect on Ge-Sb-Te phase change optical disks," J. Vac. Sci. Technol. A 17(6), Nov./Dec. 1999, pp. 3463-3466.

* cited by examiner

SEMICONDUCTOR INTEGRATED CIRCUIT DEVICE AND METHOD OF MANUFACTURING THE SAME

CLAIM OF PRIORITY

The present application claims priority from Japanese application JP 2004-348647, filed on Dec. 1, 2004, the content of which is hereby incorporated by reference into this application.

BACKGROUND OF THE INVENTION

The present invention relates generally to a semiconductor integrated circuit device and a manufacturing technique thereof and, more specifically, it relates to a semiconductor integrated circuit device including a structural portion formed by stacking a chalcogenide film on a conductive plug, as well as a technique which is effectively applied to the manufacture thereof.

Semiconductor memories include a volatile DRAM (Dynamic Random Access Memory) and a non-volatile memory semiconductor integrated circuit device such as a flash memory. An increase in the integration degree for each of the memories requires miniaturization of a memory device (cell) and the technology node (technical generation of design dimension) is going to reach the order of 0.2 to 0.1 µm. Then, along with the increased miniaturization, the amount of storage that can be retained in the cell, for example, the amount of charges accumulated in a DRAM capacitor cell is abruptly decreased. Therefore, the intensity of taken out signals is lowered making it difficult to judge the memory state between 1 and 0. As a countermeasure, technical development has been conducted, for example complication of the cell capacitor structure (provision of unevenness or the like) or tantalum oxide having high dielectric constant and put to practical use. However, the technology node for the next generation has come to a limit only by the complication of the cell or application of high dielectric film along with miniaturization. In the flash memory as the non-volatile memory, since the structure is simple, the cell structure is not so complicated as in the DRAM. However, the film thickness of the tunnel insulative film for retaining charges has been reduced to several nanometer along with miniaturization and control of the film property has resulted in a significant subject. Further, the flash memory has a drawback in that the rewriting rate of storage is lower compared with the DRAM. Under the technical background described above, there has been an increasing expectation for a semiconductor integrated circuit device mounting a new memory that is non-volatile and has a simple structure.

As a new memory semiconductor integrated circuit device capable of satisfying such a demand, development has been progressed for the technique of a semiconductor integrated circuit device using, as a memory device, a chalcogenide film (film comprising an element belonging to group VIb such as tellurium as a main ingredient) used in a DVD (Digital Versatile Disk) as an optical writing recording medium. The memory device provides memory information by utilizing a difference in the resistance by from 1 to 3 digits between the amorphous state and the crystalline state of the film. Unlike the DVD, in the memory device, the film is made crystalline or amorphous by utilizing the Joule heat generated by a pulse current. Since the phase change as described above is utilized, it is referred to as a phase change memory. It can be said that the memory is now under the process of technical development, and an alloy film of germanium (Ge), antimony (Sb) and tellurium (Te) is used as the chalcogenide material (hereinafter the alloy film is referred to as GST film). Such a phase change memory is described, for example, in U.S. Pat. No. 5,166,758 (Patent Document 1), Stefan Lai, et al. "IEEE IEDM Tech. Dig.", p. 803-806, 2001 (Non-Patent Document 1), or Y. C. Chen, et al. "Proc. IEEE Custom Integrated Circuits Conference" 2003, p. 395-398 (Non-Patent Document 2).

For the manufacture of chalcogenide, examples of the flow rate ratio of nitrogen added to the argon gas are disclosed, for example, in the following documents.

R. Kojima et al, "Jpn. J. Appl. Phys.", Vol. 37, pp. 2098-2103, 1998 (Non-Patent Document 4) discloses that the addition flow rate ratio of nitrogen added to the argon gas is about 30% to 40%. In T. H. Jeong et al, "Jpn. J. Appl. Phys.", Vol. 39, pp. 2775-2779, 2000 (Non-Patent Document 5) discloses the same extent of the addition flow rate ratio of nitrogen added to the argon gas. Further, A. Ebina et al, Vac. Sci. Technol. A", Vol. 17, pp. 3463-3466, 1999 (Non-Patent Document 6) discloses that oxygen is added and the flow rate ratio of the addition gas is about 5% to 10% (Non-Patent Document 6).

SUMMARY OF THE INVENTION

In order to apply the phase change memory to a semiconductor integrated circuit, it is necessary to satisfy various requirements. Among them, the temperature causing the phase change between an amorphous state and a crystalline state is most important in putting the memory into practical use. The phase change temperature of the GST film described above is as relatively low as about 150° C. At the phase change temperature described above, the peripheral temperature is from 70° C. to 80° C. in a case of operating a semiconductor integrated circuit capable of retaining information stored in the memory for a long time (e.g., 10 years). This is because when it is retained for a long time even at low temperatures, crystal nuclei grow in the amorphous film to gradually decrease the resistance by the phase change temperature. Such a phenomenon is called thermal retention characteristics of the phase change memory. In a case where the temperatures capable of guaranteeing long time storage of memory are such low temperatures as described above, the range for utilizing the semiconductor integrated circuit device mounting the phase change memory is extremely limited.

Since the resistivity of the GST film is as low as 1 mΩ·cm, to overheat the film by Joule heat to a temperature near the melting point to cause phase change, a current of as high as several mA is necessary. Such a current gives a significant trouble in obtaining a phase change memory of large capacity.

In the DVD, a method of adding a transition metal is attempted to increase the phase change temperature. However, as a result of applying such a material to a phase change memory semiconductor integrated circuit device, it revealed a problem in that addition of a metal by several percentages is necessary for increasing the phase change temperature. In this case, the metal is reacted with constituent elements of the chalcogenide film to form metal compounds, which forms a current path to bring about a problem incapable of rewriting the memory at a desired current.

On the other hand, the following methods have been studied in the semiconductor integrated circuit device using the phase change memory: a method of adding nitrogen or oxygen to increase the phase change temperature; a method of putting an amorphous carbon layer between a phase change material and an electrode to prevent compositional fluctuation of the phase change portion. For example, they are disclosed in U.S. Pat. No. 4,845,533 (Patent Document 2), U.S. Pat. No. 5,406,509 (Patent Document 3), Japanese Patent Laid-open No. 2002-203392 (Patent Document 4), and H. Horii, et al, "2003 Sympo. VLST Technology Dig. Tech. Papers", T12B-5, p. 177-178, 2003) (Non-patent Document 3).

However, compared with the case of not adding nitrogen, it has been found in the GST film with addition of nitrogen at about 5% to 70% as described in the reports, that remarkable sublimation occurs or tellurium or compounds of antimony and tellurium are precipitated and the film no more shows a normal phase change memory operation at a temperature of 300° C. to 650° C. applied in the course of manufacturing the semiconductor integrated circuit device. It was further found that a multiplicity of voids were formed in the film to result in a problem such as increase in the frequency of bit depletions.

An object of the present invention is to provide a semiconductor integrated circuit device mounting a phase change memory free from the foregoing problems and capable of reducing power consumption necessary for rewriting the memory by increasing the phase change temperature to 150° C. or higher and increasing the resistance of the GST film.

It has been found that such a object can be solved not only by adding oxygen, nitrogen, etc. as described in Patent Documents 2 to 4 or in Non-Patent Document 3, but also by forming compounds of germanium, zinc or antimony as the chalcogenide constituent material with oxygen, nitrogen or carbon and by limiting the amount of such elements contained in the chalcogenide film 19 shown in FIG. 1 consumed for the formation of the compounds. Further, the subjects can also be dissolved by segregating the compound to the grain boundary of the chalcogenide crystals or near the boundary with the plug electrode 18.

Principal embodiments of the invention in the present application are as shown below.

At first, the basic constitution of the memory device is as shown below.

A memory device comprises: a chalcogenide compound layer comprising tellurium as a main ingredient and at least two members selected from the group consisting of germanium, antimony, and zinc; and a first electrode layer and a second electrode layer constituting a current channel in the chalcogenide compound layer; wherein the chalcogenide compound layer is capable of conducting a phase change between two states, that is, an amorphous state and crystalline state; and wherein the chalcogenide compound layer contains at least one member selected from at least one oxide selected from the group consisting of germanium, antimony and zinc, at least one nitride selected from the group consisting of germanium, antimony, and zinc, and at least carbide selected from the group consisting of germanium, antimony, and zinc.

As a practical embodiment of the device, it is useful that the first electrode layer is a plug electrode.

Further, it is practical that at least one member selected from at least one oxide selected from the group consisting of germanium, antimony and zinc, at least one nitride selected from the group consisting of germanium, antimony, and zinc, and at least carbide selected from the group consisting of germanium, antimony, and zinc contained in the chalcogenide film is contained at a high concentration on a boundary or a portion near the boundary between the chalcogenide film and the first electrode.

Then, the basic constitution of the semiconductor integrated circuit device according to the invention of the present application is as described below.

A semiconductor integrated circuit device includes: a semiconductor substrate; a switching portion formed above the semiconductor substrate; a first insulative film containing silicon formed on the switching portion; a memory portion having a chalcogenide compound layer electrically connected directly or indirectly with the switching device; wherein the memory portion includes: a first conductor layer formed in a region where the first insulative film containing silicon is partially removed; a chalcogenide compound layer formed in contact with the first conductor layer, comprising tellurium as a main ingredient and at least two members selected from the group consisting of germanium, antimony and zinc; and a second conductor layer over the chalcogenide compound layer; wherein the chalcogenide compound layer contains at least one member selected from at least one oxide selected from the group consisting of germanium, antimony and zinc, at least one nitride selected from the group consisting of germanium, antimony, and zinc, and at least carbide selected from the group consisting of germanium, antimony, and zinc.

Of course, it is also useful such an aspect including, on the semiconductor substrate, a first insulative film containing silicon, a region where the first insulative layer containing silicon is partially removed, a third conductor layer formed in a region where the first insulative film is partially removed, and electrically connected with the switching element, at least a second insulative layer formed over the first insulative layer, and a first conductor layer formed in a region where the second insulative film is removed partially and formed in electrical contact with the chalcogenide compound layer.

Further, also in the semiconductor integrated circuit device, it is useful that at least one member selected from at least one oxide selected from the group consisting of germanium, antimony and zinc, at least one nitride selected from the group consisting of germanium, antimony, and zinc, and at least carbide selected from the group consisting of germanium, antimony, and zinc contained in the chalcogenide film is contained at a high concentration on the boundary or a portion near the boundary between the chalcogenide film and the first electrode.

Further in the practical embodiment, it is also useful that the first conductor layer present in the region where the second insulative film is removed partially (the so-called plug electrode) has an impurity barrier layer on a side wall other than a lateral surface with which the chalcogenide compound layer is in electrical contact.

The manufacturing method of the semiconductor integrated circuit device according to the invention is as described below.

A method of manufacturing a semiconductor integrated circuit device includes the steps of: preparing a semiconductor substrate having, thereabove, a silicon-containing insulative film; partially removing a desired region of the silicon-containing insulative film, forming a layer of at least one member selected from the group consisting of a metal, a metal compound and an impurity-containing silicon in the partially removed region; forming a chalcogenide compound layer comprising tellurium as a main ingredient and at least two members selected from the group consisting of germanium, antimony and zinc on the semiconductor substrate prepared by the steps so far; and forming a conductor layer on the chalcogenide compound layer; wherein the chalcogenide compound layer is formed by incorporating at least one member selected from at least one oxide selected from the group consisting of germanium, antimony and zinc, at least one nitride selected from the group consisting of germanium, antimony, and zinc, and at least carbide selected from the group consisting of germanium, antimony, and zinc.

Specifically, after the step of forming the conductor layer over the chalcogenide compound layer, a heat treatment step regarding the manufacture of the semiconductor integrated circuit device is usually conducted.

As the step of forming the chalcogenide compound layer, a sputtering method using an argon gas incorporated with at least one member selected from oxygen, moisture, nitrogen, a nitrogen oxide gas, and a carbon compound gas to the argon gas is a typical method.

The effects obtained by typical embodiments among those disclosed in the present application are to be described simply as below.

The thermal retention characteristic of the phase change memory is improved by the increase in the phase change temperature and the memory retention guaranteed (10 years' information retention) operation temperature for the memory can be improved to greatly extend the kinds of the semiconductor integrated circuit to which the phase change memory is applicable. Further, since the current required for rewriting memory can be reduced by the invention, the power consumption in the integrated circuit device mounting the phase change memory can be decreased greatly.

BRIEF DESCRIPTION OF THE DRAWINGS

Preferred embodiments of the present invention will be described in details based on the drawings, wherein.

DETAILED DESCRIPTION OF THE PREFERRED EMBODIMENTS

Figure 1:
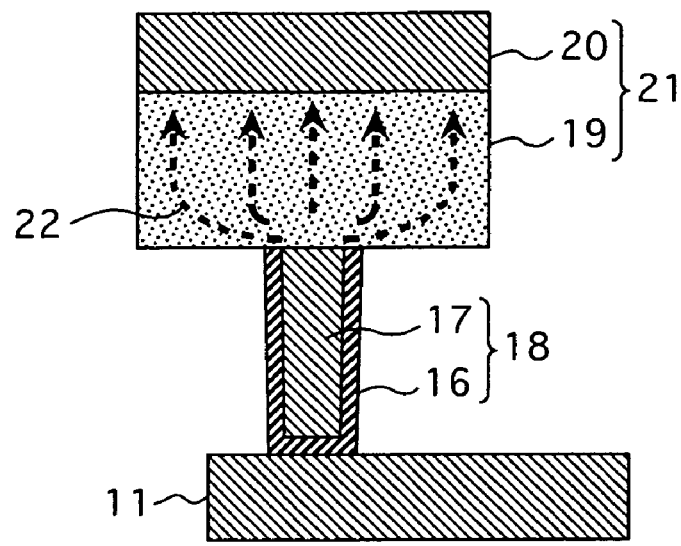
FIG. 1 is a cross-sectional view of a main portion of a phase change memory device comprising a chalcogenide film formed on a plug electrode according to the invention.

Before explanation of concrete embodiments, a description will be more specifically made of the gist of the invention.

At first, addition of additive elements to a chalcogenide thin film material is to be described more specifically below. For example, in a case of adding nitrogen to a thin chalcogenide film material, the nitrogen gas flow rate added to a sputtering argon gas in order to incorporate from 5 to 7% of nitrogen is about 30% in the existent reports. However, such an addition gas flow rate ratio causes problems as described above. They are caused since nitrogen is incorporated by an unnecessary amount in the film and, accordingly, excess nitrogen is released in the subsequent thermal step. In the invention, incorporation of such excess nitrogen is avoided and formation of tellurium nitride is restricted as much as possible and nitrides of germanium, antimony or zinc are mainly formed. For this purpose, it is necessary to restrict the flow rate ratio of the nitrogen gas added to the argon gas upon sputtering to a range from 0.5 to 3%. The maximum value in the range corresponds to a case of permitting precipitates of tellurium or antimony-tellurium compound to be partially observed. A more preferred range where such precipitation is not observed is 1% or less. In a case of the range for the amount, germanium nitride is formed and precipitated at the crystal grain boundary of $Ge_2Sb_2Te_5$, to form a state where nitrogen intrudes into the inter-lattice positions in the crystal structure. Such a state suppresses the crystal growth to provide an effect of increasing the phase change temperature and increasing the resistance of the film. Then, growing of coarse crystals is suppressed and transfer of chalcogenide constituent elements due to the heat in the thermal step in the course of manufacturing the semiconductor circuit device or during rewriting. Accordingly, a dense film with less voids is formed. Further, they suppress the transfer of elements in the process of rewriting of the phase change memory device, which can provide an effect of extending the life of the phase change memory semiconductor device.

The effect is also the case with oxygen and carbon being not restricted only to the nitrogen compound and by limiting the amount of the elements to an extremely small amount, compounds acting effectively to the improvement of the film resistance, the phase change and the phase temperature can be formed. In addition, a uniform chalcogenide film with no voids, swelling, etc. can be obtained. In a case of obtaining such an effect by incorporation of oxygen, it is necessary to limit the ratio of the addition oxygen flow rate ratio relative to the flow rate of the sputtering argon gas to 0.05% to 4% in the same manner as in the addition of nitrogen. In a case of addition of carbon since the gas added to the sputtering argon gas includes various forms such as Co, $CO_2$ or carbon hydrides, it is difficult to describe the addition amount generally but a desired effect is obtainable within a range from 0.1% to 5%.

For each of nitrogen, oxygen and carbon, the element is incorporated by a predetermined desired amount to the chalcogenide film by adding the gas of the element to the sputtering argon gas upon film formation. The elements form compounds of germanium, antimony or zinc by the heat treatment step for forming the semiconductor device after the film formation. The amount of germanium, antimony or zinc to be consumed for forming the compounds can be restricted to such an amount as not exceeding 50% of the amount of the elements such as germanium, antimony or zinc contained in the film before the heat treatment so long as this is within the range of the addition gas flow rate ratio described above. In a case where the amount of consumption approaches 50%, excessive tellurium is sometimes precipitated on the surface, but this is not an amount of hindering the manufacture of the semiconductor device.

The description has been mainly made of the method of increasing the phase change temperature and the method of increasing the resistance for reducing the power consumption, which is the object in applying the chalcogenide film to the phase change memory in view of the entire structure of the chalcogenide film.

FIG. 1 is a cross-sectional view of a main portion of a phase change memory device in which a chalcogenide film is disposed on a plug electrode. The figure shows only the relationship between electrical elements in the connection and arrangement thereof. A second plug 18 is connected with a first interconnection 11 of a semiconductor device and, a phase change memory device 21 is disposed further thereabove. The second plug 18 includes a titanium nitride barrier film 16 formed within a second opening disposed above the first metal interconnection, and a tungsten film 17 covered at the lateral surface and bottom thereof by the barrier film. Further, the phase change memory 21 has a chalcogenide film 19 and an upper electrode 20 thereover. Reference numeral 22 denotes a current in the chalcogenide film 19.

Figure 2:
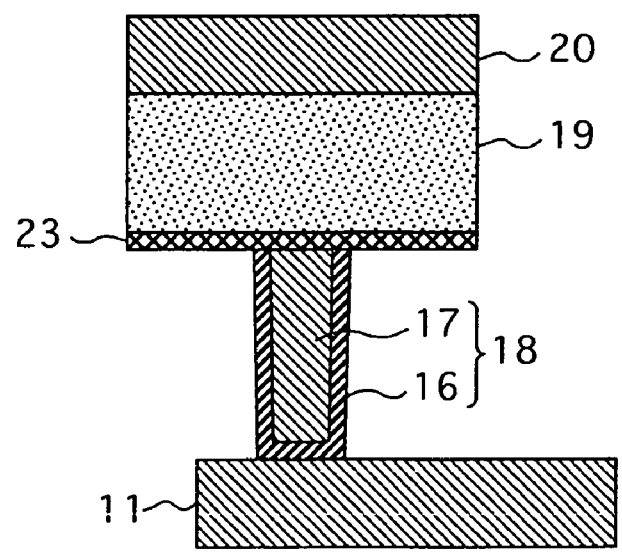
FIG. 2 is a cross-sectional view of a main portion of a memory cell in a phase change memory device according to a preferred embodiment of the invention, showing the state in which a compound comprising an oxide, nitride, or carbide having chalcogenide constituent elements is segregated near the boundary of an underlayer in the chalcogenide film.

In the phase change memory, as shown in FIG. 1, the area of the boundary between the plug electrode 18 and the chalcogenide film 19 is often smaller than the area of the electrode 20 disposed over the chalcogenide film 19. Accordingly, the density of the current 22 near the plug is higher than that near the upper electrode. In view of the above, it is not necessary to increase the resistance of the entire chalcogenide film, and a phase change can be generated even by a low current by making higher only the resistance of the chalcogenide in the region near the plug boundary. FIG. 2 is a cross-sectional view showing the constitution of this example. Also FIG. 2 shows only the relationship between the electrical elements in the connection and arrangement thereof. As shown in FIG. 2, the effect of decreasing the power consumption can be obtained also by a method of forming a compound 23 only in the chalcogenide film near the plug for making the resistance higher. The other constituent elements are the same as those shown in FIG. 1 and they are denoted by the same reference numerals as those in FIG. 1.

Figure 3:
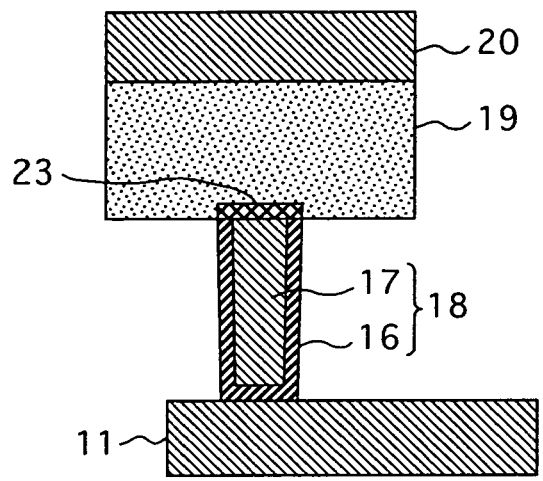
FIG. 3 is a cross-sectional view of a main portion of a memory cell in a phase change memory device according to a preferred embodiment of the invention, showing the state in which a compound comprising an oxide, nitride, or carbide having chalcogenide constituent elements is formed on or near the boundary of plug in the chalcogenide film.

FIG. 3 is a cross-sectional view of a main portion showing another constitution for decreasing the power consumption of the phase change memory. Also FIG. 3 shows only the relationship between the electrical elements in the connection and arrangement thereof as with FIG. 1. In the constitution of this example, an extremely thin compound layer 23 of nitrogen, oxygen or carbon is formed at the boundary of the chalcogenide film 19 with a conductor plug 18 such as made of a metal as the underlying electrode. It is possible to cause the phase change without supplying a high current also in a case where the resistivity of the chalcogenide film is as low as 1 mΩ·cm or less by using the Joule heat utilizing the high resistance of the compound layer 23. The method naturally shows a less effect on the object of increasing the phase change temperature.

Further, it is also effective to develop the method described above as below. That is to say, a material is incorporated in the plug material or the surface thereof: this material has negative energy required for forming the oxide, nitride or carbide with an absolute value thereof being larger than the energy of the chalcogenide constituent element to form such compounds. In addition, the material is a metal element such as silicon, titanium, tungsten, tantrum, or group IIIa to group VIa. This is because oxygen, nitrogen, and carbon incorporated in the chalcogenide film, as well as the metal elements disposed in the plug or the surface thereof by the thermal step for manufacturing the semiconductor integrated circuit can deprive oxygen, nitrogen or carbon from the compounds with the chalcogenide constituent elements and can form oxides, nitrides, carbides of such metals of high resistance in the plug surface region in a self-alignment manner.

The method of forming the chalcogenide film incorporated with the compounds of oxygen, nitrogen and carbon includes mainly a sputtering method, ion implanting method or CVD (Chemical Vapor Deposition). For the formation of the chalcogenide film, the sputtering method is mainly suitable, and the ion implantation method is suitable as a method of adding oxygen, nitrogen or carbon to a desired region of the chalcogenide film formed by the sputtering method or the CVD method to form the compounds. While the chalcogenide film can be formed by the CVD method, it has a drawback in that the technique is complicated excessively in the case of forming a multi element system composite compound as the chalcogenide used for the phase change memory. In the case of using the sputtering method, the structure of the invention is attained by introducing an elemental gas of oxygen, nitrogen or carbon and a compound gas thereof in an appropriate amount to the argon gas upon formation of the film, forming the chalcogenide film by the plasma of the gas mixture and, further, by applying a heat treatment such as a thermal step necessary for manufacturing the semiconductor integrated circuit device. However, it will be apparent that the purpose of the invention can be attained also in a case of the sputtering method by previously incorporating oxide, nitride, carbide of germanium, zinc or antimony or composite products thereof in a predetermined amount to the sputtering target material for forming the chalcogenide film.

By the ion implanting method, the compounds described above can be formed by doping oxygen, nitrogen, carbon or a plurality of such elements in a predetermined amount to a desired region or the desired depth in the film within the chalcogenide film. Accordingly, a film approximate to an insulator can be obtained by doping oxygen, nitrogen or carbon in an amount suitable to the object in the desired region and applying doping at a higher concentration to the periphery thereof. With such a constitution, current can now be supplied along a desired path within the plane of the chalcogenide film, while current 22 is supplied in the direction of the thickness of the chalcogenide film as shown in FIG. 1 in the conventional phase change memory.

Preferred embodiments of the invention will be below described specifically with reference to the drawings. In all of the drawings for explaining the embodiments, members having the same functions carry like reference numerals for which duplicate descriptions are to be omitted. Further, for the following embodiments, descriptions for the same or similar portions are not repeated, in principle, except for the case where they are particularly necessary.

Further, in the following embodiments, a description is to be made divisionally of a plurality of sections or embodiments if it is necessary for the sake of convenience, they are not irrelevant to each other but in such a relation that one is a modified example, details, supplementary descriptions, etc. for a portion or the entire portion of others. Further, in the following embodiments, when the number of elements, etc. (including the number, a value, an amount, a range, etc.) are referred to, they are not restricted to the specified number but may be more than or less than the specified number except for the case apparently restricted to the specified number in view of principle. Further, in the following embodiments, it will be apparent that the constituent elements (including elemental steps, etc.) are not always essential except for the case where they are particularly described so and are considered apparently essential in view of principle.

Likewise, in the following embodiments, when the shape, positional relationship of the constituent elements, etc. are referred to, they include those substantially approximate to or similar with the shape, etc. except for a case where they are particularly described so and apparently considered not so in view of principle. This is also applicable to the numerical values and the ranges thereof.

Further, the semiconductor integrated circuit wafer or the semiconductor wafer means, for example, silicon single crystal substrates (generally substantially circular), sapphire substrates, glass substrates and other insulative or semi insulative semiconductor substrates as well as composite substrates thereof used for manufacturing the semiconductor integrated circuits. Further, "semiconductor integrated circuit device" (or "electronic device", "electronic circuit device", etc.) is referred to, this includes not only those prepared over a single crystal silicon substrate but also includes those prepared on various kinds of substrates described above or other substrate such as SOI (Silicon On Insulator) substrates, TFT (Thin Film Transistor) liquid crystal manufacturing substrates and STN (Super Twisted Nematic) liquid crystal preparing substrates except for the case apparently described as not so.

If the material, gas composition, etc. are referred to, they show those which are pure, as well as those materials comprising the material as a main constituent element and addition of other elements is allowed unless otherwise specified.

For example, the gas composition includes main reaction gas and processing gases, as well as addition of additive gas, dilution gas, auxiliary gases used for subsidiary effects.

Further, if the silicon oxide film is referred to, this generally includes various kinds of additives and auxiliary ingredients, that is, PSG (Phospho Silicate Glass) films, BPSG (Boro-Phospho Silicate Glass) films, TEOS (Tetra-Ethoxy Silane) oxide film, silicon oxynitride films, etc., as well as other single films or composite films unless otherwise specified as not so.

Further, if silicon nitrides are referred to in various expressions, they includes not only $Si_3N_4$ but also insulative films of nitrides of silicon of similar compositions (similar composition means SiNx out of the stoichiometrical composition for $Si_3N_4$, or insulative film including elements other than Si and N, for example, H as observed in plasma CVD).

The gate oxide film includes silicon thermal oxide films and silicon oxynitride films, as well as other thermal oxide films, deposition films, and coating films and, in view of the material, includes insulative nitrides such as non-silicon metal oxides and silicon nitride other than silicon oxide films, or composite film thereof.

Further, if the material in the conductive region on the surface of the substrate or in the conductive region of the deposition film is referred to as "silicon" or "silicon based", it includes relatively pure silicon components, as well as those in which impurities or additives are added to silicon, conductive component comprising silicon as a main constituent element (for example, also silicon based alloy with 50% or more of Ge such as a SiGe alloy. For example, a gate polysilicon portion or a channel region formed as SiGe), unless otherwise specified. Further, they are also permitted to be high resistant in the initial stage of formation so long as it does not conflict technically.

Further, there are deposition films, etc. which are in an amorphous state at the initial stage of deposition but soon formed into a polycrystal by the subsequent heat treatment, they are sometimes indicated from the first in the subsequent form for avoiding contradiction in view of expression unless otherwise recognized as particularly necessary. For example, polycrystal silicon (polysilicon) is in an amorphous state at the initial stage of deposition and then converted into polycrystal silicon by the subsequent heat treatment.

However, it will be apparent that also the polycrystal silicon can be used from the initial stage. The material being in the amorphous state at the initial stage of deposition can provide a merit such as prevention of channeling during ion implantation, avoidance for the difficulty of workability depending on the granular lumpy shape such as upon dry etching, and decrease of the sheet resistance after the heat treatment, etc.

The invention concerns a semiconductor integrated circuit device arranged in a three dimensional manner using a phase change memory that utilizes the difference of resistance between the amorphous state and the crystalline state of the chalcogenide film together with an MOS transistor, etc., as well as a structure necessary for the manufacture thereof and a manufacturing method. An example of the cross-sectional structure of the device is shown in FIGS. 1 and 4.

An MOS transistor formed on one main surface of a silicon single crystal substrate is connected with a tungsten interconnection formed over an interlayer insulative film, and further with a phase change device formed on the interlayer insulative film thereover, and they are connected by way of the interlayer insulative film. In each of the examples to be described later, a description is to be made only for the portions regarding the problem to be solved by the invention in the semiconductor integrated circuit device. Other constituent elements have no direct concerns with the problem. Accordingly, since the constituent elements and the process for forming them are shared by the examples, a description is to be made only of the outline of the constituent portion and the relevant process thereof. In the semiconductor integrated circuit device, an inter-device isolation region is formed in which a silicon oxide is buried in a groove formed in the main surface of the silicon single crystal substrate.

Figure 4:
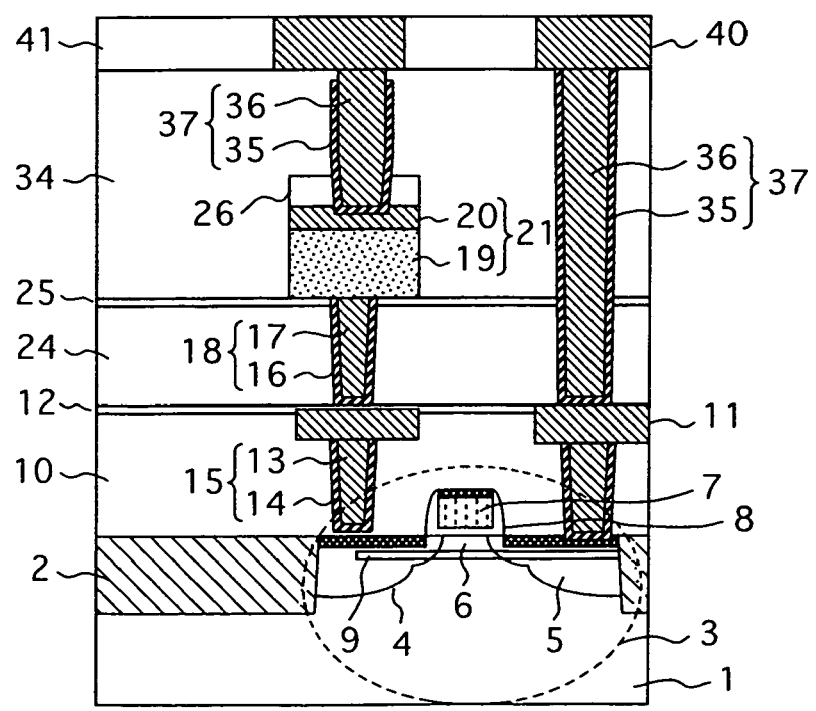
FIG. 4 is a schematic constitutional view of a typical memory cell constitution comprising a phase change memory device and a transistor according to each embodiment of the invention.

FIG. 4 is a cross sectional view for a main portion showing a constitutional example of a memory cell comprising a phase change memory and a transistor of the invention. In the example of FIG. 4, an inter-device isolation region 2 buried with silicon oxide is formed in a groove of 350 nm depth in the main surface of a silicon single crystal substrate 1. Further, n-channel and p-channel MOS transistors are formed on the main surface of the substrate. For such a constitution, FIG. 4 shows only the n channel MOS transistor 3 of 100 nm gate length. Then, this transistor is formed with the source and drain (4, 5), a gate insulative film 6 and a gate electrode 7 on the substrate surface, and a cobalt silicide 9 of 20 nm thickness formed by utilizing a silicon nitride film 8 provided on the side wall of the gate electrode by usual self aligned silicidation technology (Salicide Technology). Then, a silicon oxide film interlayer insulative layer 10 is formed over them to a thickness of 600 nm by using a CVD technique and the surface is planarized by polishing the protrusion formed due to the presence of the transistor therebelow by using a CMP (Chemical Mechanical Polishing) technique. Then a silicon nitride film 12 of 60 nm thickness is formed them.

Then, openings such as contact holes are formed to connect the source, drain or gate electrode of the transistor with a first interconnection layer 11 comprising tungsten. A metal plug 15 having a titanium nitride barrier film 13 of 10 nm thickness and a tungsten film 14 is disposed in the opening. A groove of 120 nm depth is formed by dry etching technique or the like at a desired first interconnection pattern in the interlayer insulative film surface region and tungsten is buried in the groove by using a sputtering method and a CVD method together. Thereafter, tungsten present in the portion other than the inside of the groove is polished and removed by a CMP (Chemical Mechanical Polishing) technique thereby forming a first interconnection 11 comprising tungsten. A method of forming the interconnection in the surface region of the insulative film is referred to as a damascene technique.

Further, a silicon oxide interlayer insulative film 24 is formed over them by using a plasma CVD technique. Unevenness on the surface of the interlayer insulative film is planarized by polishing using a CMP technique. Successively, a silicon nitride film 25 of 50 nm thickness is formed over them. Openings as contact holes are formed in the silicon oxide interlayer insulative film at desired positions of the first interconnection layer 11. In the opening, are formed a titanium nitride barrier film 16 of 10 nm thickness by using a CVD apparatus, and then a tungsten film 17 is formed at a thickness of 100 nm thereon by a CVD apparatus. Then, the tungsten film and the titanium nitride barrier in the excess regions other than the inside of the holes are removed by using a CMP technique to form metal (tungsten) plugs 18. The plug diameter is set to 0.15 µm. According to the feature of the invention, reaction and pealing between the tungsten plug 18 and the GST chalcogenide film 19 of 100 nm thickness are prevented even by way of a heat treatment process at 300° C. to 500° C. necessary for manufacture of the semiconductor integrated circuit such as hydrogen annealing at 450° C. applied for controlling the threshold voltages of the phase change memory formed above the tungsten plug 18 and, further the subsequent interlayer insulative film and the MOS transistor; germanium oxide, nitride or carbide is incorporated for increasing the phase change temperature of the chalcogenide film; or increasing the contact resistance at the boundary and making the resistance of the chalcogenide film higher near the plug contact portion, thereby heating the chalcogenide film near the plug efficiently to facilitate, even by a minute current, the generation of the phase change of the film by the heater effect in the high resistance region near the incorporated compound or the plug.

The gist of the invention has been described as above and, since the embodiments of the invention are versatile, the main embodiments thereof are to be set forth below.

(1) A semiconductor integrated circuit device including an MOS transistor device, a resistance device, a capacitance device, a silicon-containing insulative film formed on a first interconnection formed in the surface region of a semiconductor substrate, an opening formed by removing a predetermined region of the insulative film so as to reach the device or the first interconnection, and a plug comprising metal, a metal compound or silicon containing an n-type or p-type impurity, in which a chalcogenide compound comprising tellurium as a main ingredient and three elements of germanium, antimony and zinc or two of the three elements as a auxiliary main ingredient is precipitated above the plug, a metal film as an electrode is formed thereover, the films are fabricated into a desired pattern shape to form a phase change device, and one or more of oxide, nitride or carbide of germanium, zinc or antimony is incorporated in the chalcogenide compound film, as well as a manufacturing method thereof.

(2) A semiconductor integrated circuit device as described in item (1), wherein upon incorporation of the oxide, nitride or carbide in the chalcogenide film, supply source additives such as oxygen, nitrogen and carbon added to the film do not form the compounds but remain partially and are present at the inter-lattice positions of the crystal or crystal lattice positions when the chalcogenide crystals are formed, and a manufacturing method thereof.

(3) A semiconductor integrated circuit device as described in items (1) and (2), wherein a sputtering method is used as a method for forming the chalcogenide film, and the film is formed in a plasma atmosphere in which oxygen, moisture, nitrogen, nitrogen oxide or a carbon compound is added to the argon gas as a sputtering gas, as well as a manufacturing method thereof.

(4) A semiconductor integrated circuit device as described in item (3), wherein the oxygen, nitrogen and carbon ingredients incorporated in the film are formed into the compounds with the chalcogenide constituting elements by a thermal process applied in the course of manufacturing the semiconductor integrated circuit device after formation of the film, as well as a manufacturing method thereof.

(5) A semiconductor integrated circuit device as described in each of items (1) to (4), wherein the amount consumed as the oxide, nitride or carbide by the reaction with germanium or zinc as the constituent element of the chalcogenide film does not exceed 50% of each of the amounts of elements of germanium or zinc present in the entire film by the application of a heat treatment at 300° C. or higher necessary for the manufacture of the semiconductor integrated circuit device, as well as a manufacturing method thereof.

(6) A semiconductor integrated circuit device as described in each of items (1) to (5), wherein the amount of tellurium at the position for arranging the tellurium atoms in the crystal structure replaced with oxygen in the film in which chalcogenide is crystallized does not exceeds 30% in the entire film by the application of the heat treatment at 300° C. or higher necessary for the manufacture of the semiconductor integrated circuit device, as well as a manufacturing method thereof.

(7) A semiconductor integrated circuit device as described in each of items (1) to (6), wherein the oxygen addition amount is restricted so that tellurium or antimony-tellurium compound is not precipitated in the surface region of the chalcogenide or, if precipitated, the precipitates do not form a continuous film but are present at least in an island shape after application of the heat treatment at 300° C. or higher necessary for the manufacture of the semiconductor integrated circuit device, as well as a manufacturing method thereof.

(8) A semiconductor integrated circuit device as described in each of (1) to (7), wherein the oxygen addition amount is restricted to such conditions that swelling or peeling is less caused in the metal film for use in the electrode formed on the chalcogenide film by sublimation of tellurium as the constituent element of the chalcogenide film or dissociation of the addition oxygen by the heat treatment at 300° C. or higher necessary for the manufacture of the semiconductor integrated circuit device, as well as a manufacturing method thereof.

(9) A semiconductor integrated circuit device as described in each of items (5) to (8), wherein the flow rate ratio of the oxygen gas introduced into a discharge chamber to the flow rate of the argon gas is restricted within a range from 0.05/99.95 to 4.00/96.0 upon discharging while mixing the oxygen gas with the argon gas when the chalcogenide film is formed by the sputtering method in order to restrict the amount of the addition oxygen in the chalcogenide film to the range satisfying the restricting condition, as well as a manufacturing method thereof.

(10) A semiconductor integrated circuit device as described in each of items (1) to (9), wherein oxygen and the oxygen compound added to the chalcogenide film is at a high concentration at the boundary of the underling layer for the film, or in the film in the vicinity thereof, particularly, near the boundary of the plug electrode, as well as a manufacturing method thereof.

(11) A semiconductor integrated circuit device as described in each of items (1) to (10), wherein a germanium oxide, zinc oxide, antimony oxide or a mixture of such oxides is present at the boundary between the chalcogenide film and the plug electrode, as well as a manufacturing method thereof.

(12) A semiconductor integrated circuit device as described in item (11), wherein the oxide is formed by reacting oxygen supplied from the adhered oxygen or metal oxide present on the surface of the plug, or oxygen supplied from oxygen, moisture, nitrogen oxide or carbon oxide added to the chalcogenide film with germanium, zinc or antimony constituting the chalcogenide film, as well as a manufacturing method thereof.

(13) A semiconductor integrated circuit device as described in each of items (1) to (12), wherein a phase change device is configured such that a pulse current is supplied between a lower plug electrode and an upper electrode of the chalcogenide film, the film is over heated instantly by the Joule heat caused by the resistance of the film to attain a crystalline state or an amorphous state, and different memory states are due to the difference of the resistance value between the states, and the concentration of the oxide in the region in the chalcogenide film near the plug electrode in which the change of state can be formed due to the Joule heat by the pulse current is higher than that in the region of the chalcogenide film with a less effect of the current heating, as well as a manufacturing method thereof.

(14) A semiconductor integrated circuit device as described in each of items (1) to (13), wherein the chalcogenide film is a polycrystal material and comprises an assembly of crystal grains in which small crystal grains are present so as to surround coarse crystal grains, as well as a manufacturing method thereof.

(15) A semiconductor integrated circuit device as described in item (14), wherein the ratio of the oxide of the group of small crystal grains at the periphery of the coarse crystal grains is higher than that of the coarse crystal grains, as well as a manufacturing method thereof.

(16) A semiconductor integrated circuit device as described in each of items (1) to (15), wherein the chalcogenide film is a polycrystal body and a compound mainly comprising oxygen, particularly, oxide of germanium, zinc or antimony is segregated at the grain boundary of each of the crystal grains, as well as a manufacturing method thereof.

(17) A semiconductor integrated circuit device as described in each of items (1) to (6), wherein the main additive element is nitrogen, as well as a manufacturing method thereof.

(18) A semiconductor integrated circuit device as described in item (17), wherein at least one of nitrogen, nitrogen oxide or a gas such as ammonia is used as a nitrogen supply source, as well as a manufacturing method thereof.

(19) A semiconductor integrated circuit device as described in item (18), wherein the nitrogen addition amount is restricted such that tellurium or an antimony-tellurium compound is not precipitated in the surface region of the chalcogenide or, if precipitated, the precipitates do not form a continuous film but are present at least in an island shape after application of the heat treatment at 300° C. or higher necessary for the manufacture of the semiconductor integrated circuit device, as well as a manufacturing method thereof.

(20) A semiconductor integrated circuit device as described in each of items (1) to (6), (17) and (18), wherein the nitrogen addition amount is restricted to such a range that swelling or peeling is less caused in the metal film for use in the electrode formed on the chalcogenide film by sublimation of tellurium as the constituent element of the chalcogenide film or dissociation of the addition nitrogen by the heat treatment at 300° C. or higher necessary for the manufacture of the semiconductor integrated circuit device, as well as a manufacturing method thereof.

(21) A semiconductor integrated circuit device as described in item (19) or (20), wherein the flow rate ratio of the nitrogen gas introduced into a discharge chamber to the flow rate of the argon gas is restricted within a range from 0.05/99.95 to 3.00/97.0 upon discharging while mixing the oxygen gas to the argon gas when the chalcogenide film is formed by the sputtering method in order to restrict the amount of the addition nitrogen in the chalcogenide film to the range satisfying the restricting condition, as well as a manufacturing method thereof.

(22) A semiconductor integrated circuit device as described in each of items (1) to (6), (17) and (21) above, wherein the nitrogen and the nitrogen compound added to the chalcogenide film is at a high concentration near the boundary of the lower plug therebelow, as well as a manufacturing method thereof.

(23) A semiconductor integrated circuit device as described in item (22), wherein nitride of germanium, zinc or antimony nitride is present at a boundary between the chalcogenide film and the plug, as well as a manufacturing method thereof.

(24) A semiconductor integrated circuit device as described in (23), wherein the germanium nitride is formed by reacting nitrogen supplied from the metal nitride formed in the plug surface or nitride or the nitride compound added to the chalcogenide film with germanium, zinc or antimony constituting the chalcogenide film, as well as a manufacturing method thereof.

(25) A semiconductor integrated circuit device as described in each of items (1) to (24), wherein the chalcogenide film is a polycrystal body and comprises an assembly having small crystal grains smaller at least by ½ or less than the size of crystal grains formed in a case of not adding nitrogen, that is, 50% or more of crystal grains in the film comprises small crystal grains of 40 nm or less, as well as a manufacturing method thereof.

(26) A semiconductor integrated circuit device as described in each of items (1) to (6), (17), and (25), wherein the film crystallized by the application of a heat treatment at 300° C. or higher necessary for the manufacture of the semiconductor integrated circuit device comprises 30% by weight or less of chalcogenide crystal grains of hexagonal close-packed structure and 70% by weight or more of chalcogenide crystal grains of face-centered cubic structure or sodium chloride, as well as a manufacturing method thereof.

(27) A semiconductor integrated circuit device as described in each of items (1) to (6), (17), and (26), wherein the density of the chalcogenide film is 1.5 times or more the density of the chalcogenide film with no addition of nitrogen, or $4.5/cm^3$ or more by the application of a heat treatment at 300° C. or higher necessary for the manufacture of the semiconductor integrated circuit device, as well as a manufacturing method thereof.

(28) A semiconductor integrated circuit device as described in each of items (1) to (6), wherein the main additive element is carbon, as well as a manufacturing method thereof.

(29) A semiconductor integrated circuit device as described in item (28), wherein carbon or gaseous carbon dioxide or an organic gas such as of methyl alcohol, ethyl alcohol, acetone or other hydrocarbon compound is used as a carbon supply source, as well as a manufacturing method thereof.

(30) A semiconductor integrated circuit device as described above in item (29), wherein the addition amount of carbon is restricted such that tellurium or an antimony-tellurium compound is not precipitated in the surface region of the chalcogenide or, if precipitated, the precipitates do not form a continuous film but are present at least in an island shape after application of the heat treatment at 300° C. or higher necessary for the manufacture of the semiconductor integrated circuit device, as well as a manufacturing method thereof.

(31) A semiconductor integrated circuit device as described in each of items (1) to (6) and (28) to (29) above, wherein the addition amount of carbon is restricted to such a range that swelling or peeling is less caused in the metal film for use in the electrode formed on the chalcogenide film by sublimation of tellurium as the constituent element of the chalcogenide film or dissociation of the addition oxygen by the heat treatment at 300° C. or higher necessary for the manufacture of the semiconductor integrated circuit device, as well as a manufacturing method thereof.

(32) A semiconductor integrated circuit device as described in items (30) to (31), wherein the flow rate ratio of the carbon or carbon compound gas introduced into a discharge chamber to the flow rate of the argon gas is restricted within a range from 0.01/99.99 to 5.00/95.0 upon discharging while mixing the carbon or carbon compound gas with the argon gas when the chalcogenide film is formed by the sputtering method in order to restrict the addition amount of carbon in the chalcogenide film to the range satisfying the restricting condition, as well as a manufacturing method thereof.

(33) A semiconductor integrated circuit device as described in each of items (28) to (32), wherein carbon and a carbon compound added to the chalcogenide film is at a high concentration at the boundary of the underling layer for the film, or in the film in the vicinity thereof, particularly, near the boundary of the plug electrode, as well as a manufacturing method thereof.

(34) A semiconductor integrated circuit device as described in each of items (1) to (33), wherein the carbide of germanium, zinc or antimony is present at the boundary between the chalcogenide film and the plug electrode, as well as a manufacturing method thereof.

(35) A semiconductor integrated circuit device as described in item (34), wherein the germanium carbide is formed by reacting carbon supplied from the metal carbide present on the surface of the plug, or carbon supplied from carbon or carbon compound added to the chalcogenide film with germanium, zinc or antimony constituting the chalcogenide film, as well as a manufacturing method thereof.

(36) A semiconductor integrated circuit device as described in each of items (1) to (35), wherein the chalcogenide film is a polycrystal body and comprises an assembly having small crystal grains smaller at least by ½ or less than the size of crystal grains formed in a case of not adding carbon, that is, 50% or more of crystal grains in the film comprises small crystal grains of 40 nm or less, as well as a manufacturing method thereof.

(37) A semiconductor integrated circuit device as described in each of items (1) to (36), wherein the chalcogenide film is a polycrystal body, carbon is segregated at the grain boundary of each of the crystal grains, and a compound comprising carbon as a main ingredient, particularly, the carbide of germanium, zinc or antimony is present in the segregated region, as well as a manufacturing method thereof.

(38) A semiconductor integrated circuit device as described in each of items (28) to (37), wherein the film crystallized by the application of a heat treatment at 300° C. or higher necessary for the manufacture of the semiconductor integrated circuit device comprises 30% by weight or less of chalcogenide crystal grains of hexagonal close-packed structure and 70% by weight or more of chalcogenide crystal grains of face-centered cubic structure or sodium chloride, as well as a manufacturing method thereof.

(39) A semiconductor integrated circuit device as described in each of items (1) to (38), wherein ion implantation is used upon incorporation of oxygen, nitrogen, carbon or two or more of such elements at a desired position of the chalcogenide film, as well as a manufacturing method thereof.

(40) A semiconductor integrated circuit device as described in item (39), wherein the concentration of the ion implanted element is increased only in the vicinity of the boundary just above the plug underlying the chalcogenide film, as well as a manufacturing method thereof.

(41) A semiconductor integrated circuit device as described in (39), wherein the amount of ions implanted in the region just above the plug in the chalcogenide film plane is less than the amount of ions implanted in the peripheral region thereof, as well as a manufacturing method thereof.

(42) A semiconductor integrated circuit device as described in item (41), wherein the resistivity is 100 kΩ·cm or more even after application of a heat treatment at 300° C. or higher necessary for the manufacture of the semiconductor integrated circuit device, by ion implantation at high concentration to the peripheral region, and the resistance in the implantation region at low concentration just above the plug is lower than that in the peripheral region, thereby restricting the current passing region to the low resistance region, as well as a manufacturing method thereof.

(43) A semiconductor integrated circuit device as described in item (39), wherein the concentration of the implanted ions in a desired pattern region of the chalcogenide film is made lower while that in the peripheral region thereof is made higher, thereby restricting the current passing region in the film plane, as well as a manufacturing method thereof.

(44) A semiconductor integrated circuit device as described in each of items (1) to (43), wherein the concentration of germanium, zinc or an antimony compound in the chalcogenide film near the underlying plug electrode is made higher in the portion other than the rewriting region, the upper electrode or in the vicinity of the electrode larger than the plug electrode area, as well as a manufacturing method thereof.

(45) A semiconductor integrated circuit device as described in each of items (1) to (44), wherein the concentration of antimony in the chalcogenide film near the underlying plug electrode is made higher than that in the portion other than the rewriting region and in the vicinity of the electrode, as well as a manufacturing method thereof.

(46) A semiconductor integrated circuit device as described in each of items (1) to (45), wherein the concentration of tellurium in the chalcogenide film near the underlying plug electrode is made lower than that in the portion other than the rewriting region and in the vicinity of the electrode, as well as a manufacturing method thereof.

(47) A semiconductor integrated circuit device as described in each of items (1) to (46), wherein a chalcogenide film is formed after previous formation of a thin film comprising a germanium, zinc or antimony compound of oxygen, nitrogen or carbon, as well as a manufacturing method thereof.

(48) A semiconductor integrated circuit device as described in each of items (1) to (47), wherein the oxygen, nitrogen or carbon compound is formed of the compound mainly comprising germanium, as well as a manufacturing method thereof.

(49) A semiconductor integrated circuit device as described in each of items (1) to (48), wherein the oxygen, nitrogen or carbon compound of germanium, zinc or antimony formed at the boundary between the underlying layer and the plug electrode is present in the pores of the chalcogenide compound in the form of a continuous layer, or a discontinuous body such as in a state of an island shape or in a state where a number of pores are formed in the film, as well as a manufacturing method thereof.

The oxide, nitride, and the carbide may be either in a amorphous or crystalline state and in a crystalline state, they are $GeO_2$, $Ge_3N_4$, or Gec for germanium, $Sb_2O_3$, $Sb_2O_4$, $Sb_2O_5$, ammonium antimonide or and antimonium carbide for antimony, zinc is ZnO, $ZnO_2$, $ZnN_2$, $ZnCO_3$ or $ZnC_2O_4$ for zinc, and a compound, oxides, nitrides or carbides of Ge, Sb, or Zn. Further, those compounds deviated from the stoichiometrical composition described above are also included further, they also include a compound containing two or more of elements of oxygen, nitrogen, and carbon.

Specific examples of the embodiments will be described more specifically by way of the following examples.

EXAMPLE 1

Figure 14:
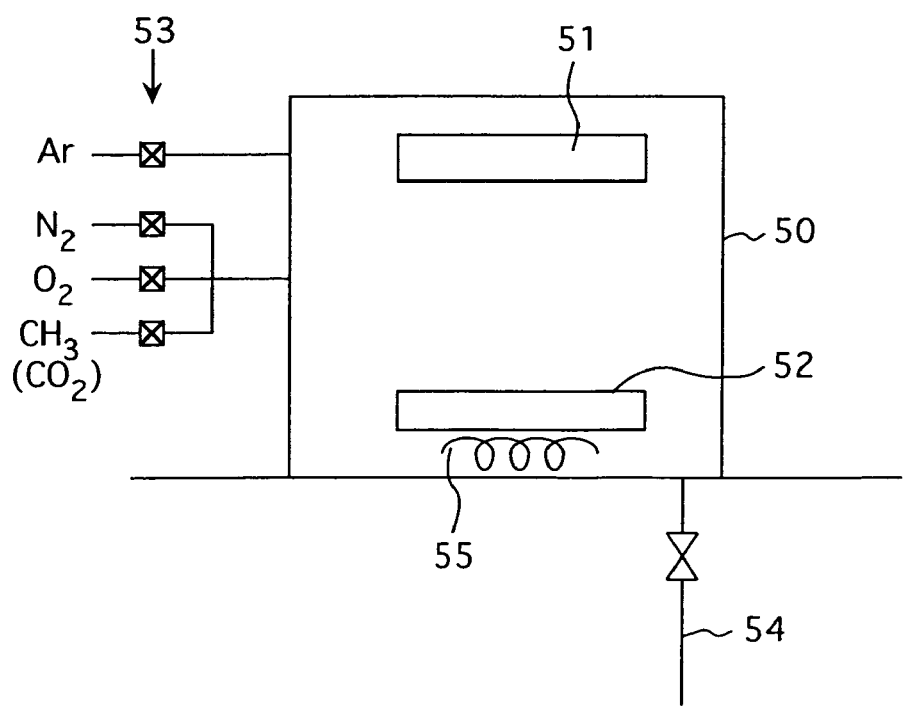
FIG. 14 is a schematic explanatory diagram showing a sputtering apparatus used for manufacturing a memory device according to the invention.

In the example, the progress of the experiment for solving the problem relating to the invention and the phenomena found therein are mainly explained. For the preparation of a chalcogenide film as a main portion of the invention, a sputtering apparatus was used. The outline is shown in FIG. 14. A usual apparatus may suffice as the sputtering apparatus. For example, a sample holding substrate 52, and a heater 55 and a target 51 which are opposed to the sample holding substrate 52 are placed in a vacuum chamber 50. An evacuation end 54 is disposed at one end of the vacuum chamber 50. The temperature is made variable from about −33° C. to 300° C. Various gas introduction ends 53 are disposed at the other end of the vacuum chamber 50. Gases are for example Ar, nitrogen oxygen, $CH_3$, $CO_2$, etc. in this example.

On the tungsten plug 18 described previously, the GST film 19 was formed by using the sputtering apparatus for preparing the phase change memory device 21 comprising the GST film. In this case, the GST film was formed by generating an RF plasma while introducing a gas controlled to a nitrogen gas/(argon gas+nitrogen gas) mixed flow rate ratio (hereinafter referred to as a nitrogen gas mixed flow rate ratio) to a value within a range from 5% to 7% into a sputtering chamber as a film forming chamber. The electric power necessary for generation of the RF plasma was set to a range from 50 W to 400 W and the substrate temperature upon formation of the chalcogenide film was set to a temperature from room temperature to 150° C. The tungsten film was deposited to 50 nm to form an upper electrode 20 of the phase change memory device. Successively, to fabricate the GST film 19 and the tungsten film 20 in the pattern shape of the phase change device 21, a PTEOS film 26 was deposited to 100 nm as a hard mask material at 390° C. In this case, a problem such as frequent occurrence of dome-shaped swelling of from several microns to several tens microns and partial bursting thereof were caused. The state was examined by using a SEM (Scanning Electron Microscope).

As a result, a number of voids and a number of precipitated crystals were observed in the GST film and on the surface thereof, respectively. Then, as a result of XRB (X-ray diffraction), it was found that the deposits were Te crystals. Then, those other than the deposits were in the amorphous state and growing of GST crystals was not observed. Further, the element distribution was analyzed by 2-dimensional AES (Auger Electron Spectroscopy). As a result, it was found that the deposits were tellurium and the remaining region comprised germanium, antimony and tellurium. Further, by the gas analysis for the elements emitted from the GST film during heating, it was found that most of nitrogen contained in the film was dissociated by the thermal process for forming the PETOS film, and sublimation of tellurium was also promoted. It is probable that they raised the tungsten film covering the GST film to result in dome-shaped swelling or bursting.

Then, for further studies of the effect of nitrogen, the following experiment was conducted. A heat treatment at 100° C. to 600° C. in a nitrogen atmosphere was conducted in a state of not forming the tungsten film 20 or the PTEOS film 26 on the GST film 19. As a result, the following was found.

When a heat treatment at 250° C. was applied, for the film formed at a nitrogen gas mixed flow rate ratio (nitrogen gas/ (argon gas+nitrogen gas), hereinafter referred to as an addition nitrogen gas flow mixing ratio) of 4% or more, not uniformity in the plane at a level capable of being distinguished even under an optical microscope was observed. In addition, it was found that sublimation of the chalcogenide film constituent elements such as tellurium was more significant in the nitrogen added GST film than that in the film with no addition of nitrogen. It is probable that tellurium was once deposited on the film surface and then caused sublimation.

Further, it is probable that sublimated tellurium was deposited again on the surface of the GST film to grow Te crystals.

It is probable that since sublimation of the constituent element and dissociation of nitrogen were remarkable in the film formed at the gas mixed flow rate ratio of 4% or more as described above, a number of voids and a number of precipitated crystals were formed in the GST film and on the surface thereof, respectively. However, the followings were found in the series of experiments. That is, when the gas flow rate ratio was less than 4%, the situation was changed drastically.

Figure 5A:
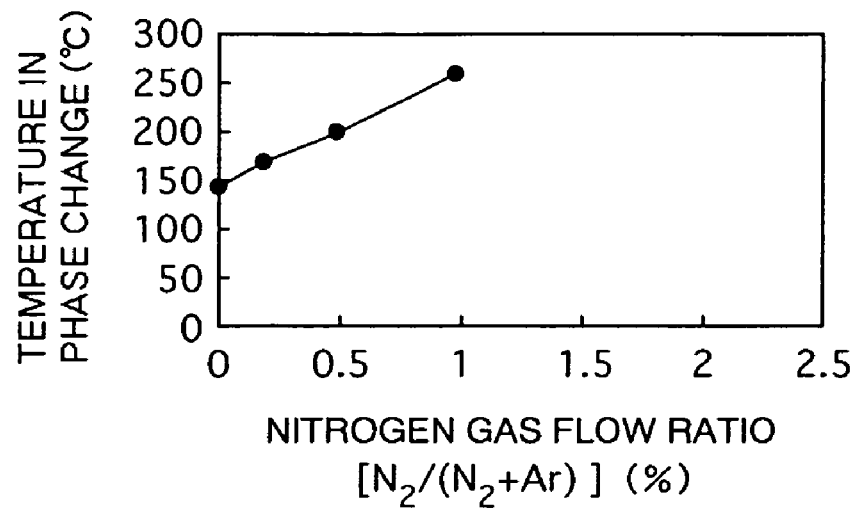
FIG. 5A is a graph showing the relationship between a mixed flow rate ratio of nitrogen gas added to a sputtering argon gas upon formation of a GST film according to the invention and a phase change temperature of the obtained film.
Figure 5B:
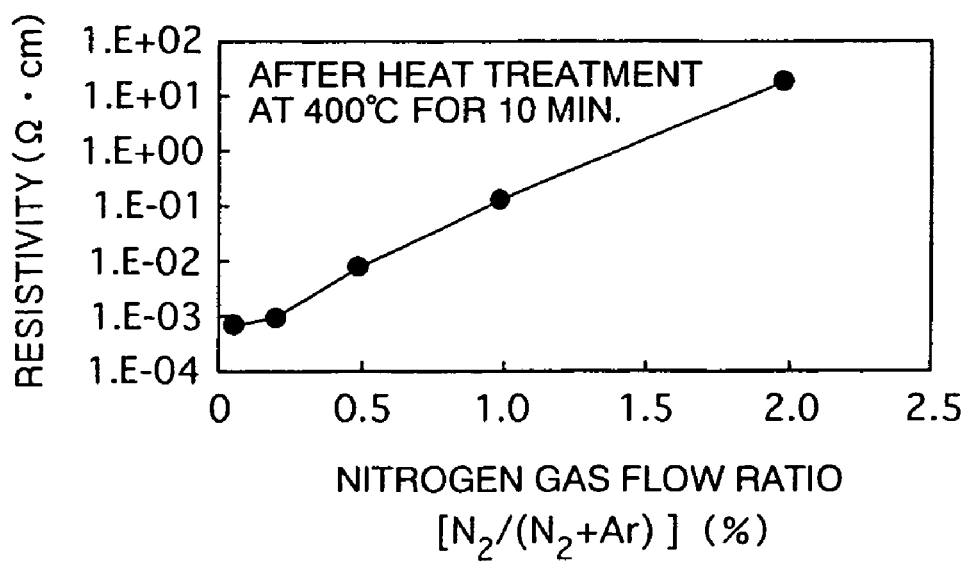
FIG. 5B is a graph showing the relationship between a mixed flow rate ratio of nitrogen gas added to a sputtering argon gas upon formation of a GST film according to the invention and a resistivity of the obtained film further subjected to a heat treatment at 400° C.

From the nitrogen gas mixed flow rate ratio in the slight amount of 0.05%, the effect appeared in the phase change temperature and the GST film. FIG. 5A is a graph showing the relationship between the addition nitrogen gas flow rate ratio and the phase change temperature of the GST film upon formation of the GST film. The abscissa represents the addition nitrogen gas flow rate ratio to be added and the ordinate represents the phase change temperature. FIG. 5B shows the relationship between the addition nitrogen gas flow rate ratio upon formation of the GST film and the resistivity of the GST film after the heat treatment at 400° C. for 10 min. The abscissa represents the addition nitrogen gas flow rate ratio and the ordinate represents the resistivity. As apparent from both of the graphs the change of the phase change temperature along with the addition nitrogen gas flow rate ratio is remarkable and the resistivity of the film is increased further outstandingly. Further, in the so-called standard GST film formed only with the argon gas not using the mixed gas, the phase change temperature is at about 150° C. Generally, $Ge_2Sb_2Te_5$ crystals of the face-centered cubic structure (FCC) or sodium chloride (NaCl) structure are formed in a range of the heat treatment temperature from 150° C. to 220° C. and $Ge_2Sb_2Te_5$ crystals of the hexagonal close packed structure (hcp) are formed at higher temperatures Then, since the phase change rate from an amorphous state to a crystalline state is faster in the former crystal structure, it is desirable that crystals of the former rather than the latter be formed in a memory requiring high speed rewriting. It was found that for the GST film formed with the nitrogen gas mixed flow rate ratio in a range from 0.05% to 4% or less, the temperature where the FCC crystal structure was transferred to the hcp crystal structure increased as the phase change temperature increased (the elevation rate of the phase change temperature tended to be saturated in a range from 1% to 4%), and the hcp structure crystals were not formed even by way of a heat treatment at 450° C. such as hydrogen annealing in the manufacturing process for the semiconductor integrated circuit device and only the FCC crystal structures were grown as the flow rate ratio increased to 0.5% or higher.

In the range of the mixed gas flow rate ratio, the crystal structure comprising only the FCC crystal structure is not always formed in all the region. Within the range of the mixed gas flow rate from 0.05% to 0.5%, the film after the heat treatment at 300° C. or higher necessary for the manufacture of the semiconductor integrated circuit comprises 70% or more of the crystal grains comprising chalcogenide crystals of face-centered cubic structure or sodium chloride crystal structure, and about 30% of hexagonal close packed structure chalcogenide crystals. While it is desirable that 100% crystal grains be face-centered cubic structure, there is no trouble in the high speed operation of the semiconductor integrated circuit device mounting the phase change memory so long as the face-centered cubic structure is present by 70% or more.

Accordingly, it is advantageous to form the film at a mixed gas flow rate ratio within the range described above also in view of the high speed rewriting of the phase change memory device.

The chalcogenide film is a polycrystal body and comprised of small crystal grains with the size smaller at least by ½ or less than the crystal grains formed with no addition of nitrogen, that is, 50% or more of the crystal grains in the film is 40 nm or less. Each of the crystal grains can contain finer sub-crystal grains with a size of 10 nm or less in some cases. Such a state is advantageous in forming a fine phase change device by using a dry etching technique or the like and it is further preferred for the improvement of the yield in the manufacture of the semiconductor integrated circuit device since the film is made uniform.

Further, the relationship between the density of the chalcogenide film after the heat treatment at 300° C. or higher necessary for the manufacture of the semiconductor integrated circuit device and the nitrogen gas mixed flow rate ratio was examined. An X-ray interference method was applied to the measurement of the density. The surface roughness of the film can be determined simultaneously with the density by the method.

The density and the unevenness of the film were scarcely changed before and after the heat treatment thereof using only the argon gas and the density was about 3.0 $g/cm^3$ and the unevenness expressing the surface roughness was about 0.4 nm. On the other hand, the film density before the heat treatment increased monotonously along with the increase of the nitrogen gas mixed flow rate ratio and the roughness of the film surface was scarcely depended on the flow rate ratio. However, in a case where the GST film was subjected to the thermal step at a temperature in a range from 300° C. to 500° C. for the manufacture of the semiconductor integrated circuit device, the density increased abruptly up to the mixed gas flow rate ratio of 4% or less and reached 4.5 $g/cm^3$. However, in a case where the gas mixed flow rate ratio exceeded 4%, the density abruptly decreased to 2.5 $g/cm^3$. Then, the surface roughness increased abruptly and unevenness reached 1 nm or more. Accordingly, also with a view point of the film density and the surface roughness, it was found that formation of the film with the nitrogen gas at a flow rate ratio exceeding 4% to be mixed with the argon gas has no merit. It was also confirmed that voids in the film abruptly decreased by the heat treatment along with the increase of the film density.

Whether the state of the film by the heat treatment differs greatly or not in the region at a low mixed gas flow rate ratio and in the region where it is as high as 4% or more was to be clarified. For this purpose, the film structure of the film formed at each of the mixed gas flow rate ratios described above before and after the heat treatment was examined by absorption near edge spectrum evaluation (XAFS) or X-ray photoelectron spectroscopy (XPS) for film constituent elements by using high energy emission light equipment (synchrotron emission light). As a result, nitrogen taken into the film in the region at the mixed gas flow rate ratio of less than 4% was mainly concerned with germanium and free nitrogen was scarcely present. A portion was bonded to form a germanium nitride. Then it was found that the ratio of the amount of germanium contained in the GST film bonded with nitrogen increased along with the mixing ratio. However, when the gas low rate mixing ratio reached 4%, almost of germanium in the film formed nitride and the GST crystals could no more be formed. Then, it is probable that antimony and tellurium, which could no more constitute the GST crystals, formed antimony-tellurium compounds, and tellurium present by about 50% of the film composition sublimed and re-precipitated to crystallize on the film surface also with the effect of the high melting point and the vapor pressure thereof.

The result of the experiment with an aim of improving the film property has been described mainly with respect to the example. Then, a description is to be made of the result of applying the films to the semiconductor integrated circuit device shown in FIG. 4. The formation of the chalcogenide film is as has been described above. In a case of controlling the mixed flow rate ratio of the addition nitrogen gas to be introduced to the sputtering chamber to a slight amount within a range from 0.05% to 1%, it is difficult to control by using respective mass flow meters for the argon gas and the nitrogen gas as usual since the meters are out of the guaranteed control range. In this example, this control is executed by providing a reservoir containing an argon gas with addition of 1% nitrogen gas and controlling the flow rate from the reservoir gas and the pure argon line gas by using separate mass flow meters. The GST film 19 of 100 nm thickness was formed while setting the flow rate ratio to 0.5% and at a substrate temperature of 70° C.

The resistivity of the GST film of the phase change memory cell showed a value of $10 \times 10^{-2} \Omega \cdot cm$ after the thermal step such as hydrogen annealing at 450° C. for 10 min. The value is higher by about one digit than the resistivity of a standard GST film formed by using only the argon gas. As a result, it was succeeded in decreasing the pulse current required for rewriting from the crystalline state to the amorphous state by about one digit, i.e., to 110 µA at the 200 nsec pulse width in the phase change memory cell having the same tungsten plug diameter as that shown previously compared with the case of using a GST film formed by using only the argon gas. Further, since $Ge_2Sb_2Te_5$ crystals of the FCC structure were formed even when they were crystallized, the pulse current rising and falling times could be made shorter than in the memory cell using the existent film in which hcp crystals were formed, the rewriting rate of the phase change memory could be increased by about 10%.

Further, the phase change temperature increased by about 50° C. compared with the case of using the existent standard GST film and the temperature capable of operation while ensuring ten years' storage retention could be increased up to the range of temperature from 120° C. to 140° C.

EXAMPLE 2

In the phase change memory of Example 1, a predetermined amount of germanium nitride is formed over the entire chalcogenide film. Example 2 uses a composite GST film.

Figure 6:
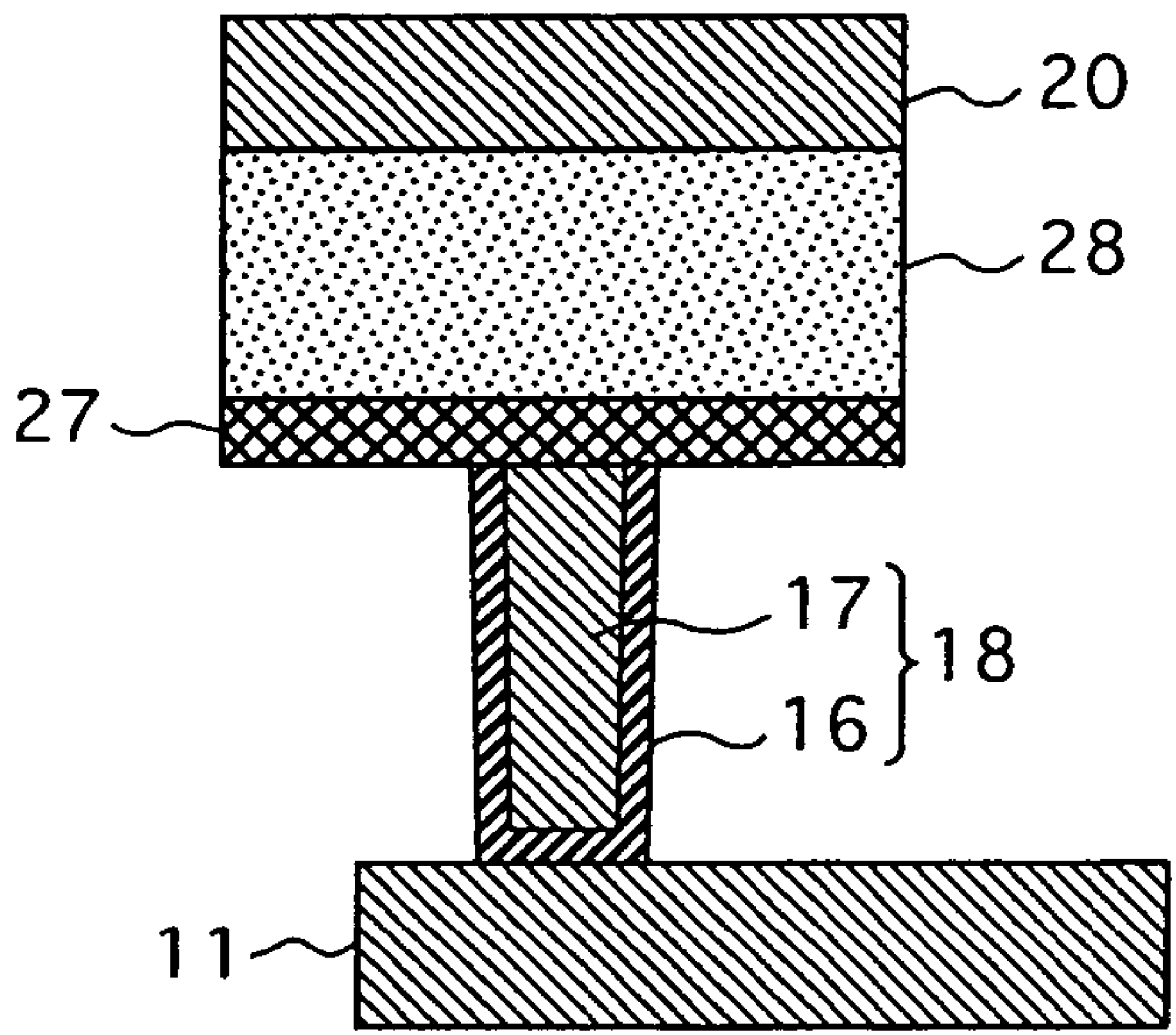
FIG. 6 is a cross-sectional view of a main portion of a phase change memory device in Example 2.

In this example, as shown in FIG. 6, a first GST film 27 of 20 nm thickness was formed at first at a mixing ratio of 2% nitrogen gas and argon gas and, successively, a second GST film 28 of 80 nm thickness was formed by using only the argon gas to form a composite GST film as a memory film of a phase change memory. In this structure, nitrogen diffused from the first GST film to the second GST film in the thermal step at 450° C. after formation of the composite film to form a concentration gradient of a germanium nitride compound from the vicinity of the plug boundary to the second GST film. Near the boundary, about 50% of the existent germanium formed a nitride compound and the remaining portion contributed to GST crystals, which was decreased to several % near the surface of the second GST film. In this example, although the pulse current of the same amplitude as in Example 1 was used, the pulse current required for rewriting from the crystalline state to the amorphous state could be decreased to 80 µA. This is because rewriting could be attained at a lower current since the current density near the plug increased more than in other region as described previously and the resistivity of the chalcogenide film near the boundary could be increased more than that in Example 1.

The phase change temperature could be lower than Example 1 by about 10° C. and the ten years guaranteed temperature for the memory retention operation could be increased to about 120° C.

In this example, the size of grains decreased as they were nearer to the plug boundary corresponding to the crystal state of the GST film by the manufacturing process for the semiconductor integrated circuit, that is, to the concentration distribution of the formed germanium nitride. Accordingly, it is probable that the resistance of the GST film is correspondingly increased at a portion nearer to the boundary.

In this example, while the GST film was formed by using a gas only comprising argon upon formation of the second GST film, the temperature could be increased by about 10° C. than in Example 1 by decreasing the addition nitrogen gas mixed flow rate ratio to 0.05% upon film formation.

EXAMPLE 3

In Example 2, the GST film was formed by two stages divisionally so as to increase the concentration of germanium nitride in the GST film near the plug boundary. Example 3 shows an example of forming tungsten nitride on the surface of the tungsten plug.

In this example, the surface of the tungsten was previously nitrided by nitrogen plasma to form a tungsten nitride of about 10 nm thickness. Then, a GST film of 100 nm thickness was formed at an addition nitrogen gas mixed flow rate ratio of 0.01%. In this example, the GST film comprised a single layer. The tungsten nitride is extremely instable and easily releases nitrogen. Accordingly, in the phase change memory device formed by using such a structure, nitrogen released from the tungsten nitride and germanium of the GST film were mainly reacted in the thermal step necessary for the manufacture of the semiconductor integrated circuit device, to form a germanium nitride only near the plug boundary in a self-alignment manner and a heater layer of high resistance could be formed. In this example, the mixed flow rate ratio of the nitrogen gas was defined as 0.1% upon formation of the GST film. This could provide an effect of increasing the phase change temperature by about 30° C. compared with the case of forming the film only by using argon gas.

In the examples described above, while the GST film was formed in the plasma atmosphere in which a nitrogen gas was mixed with the argon gas, it will be apparent that an ammonia gas can be utilized instead of the nitrogen gas. Further, nitrogen oxide gas can also be used. In this case, an effect obtainable in a case of mixing an oxygen gas with the argon gas to be described in the following example was also resulted simultaneously.

EXAMPLE 4

In Example 4, a gas to be mixed with the argon gas was oxygen unlike the examples described above, also in the case of oxygen, a reservoir containing argon gas with addition of 1% oxygen and a reservoir with addition of 50% oxygen were provided, and by controlling the reservoir gas and the argon pipeline gas by respective different mass flow meters, a oxygen gas/(argon gas+oxygen gas) flow rate ratio (hereinafter referred to as oxygen gas mixed flow rate ratio) in a range from 0.05% to 10% was attained.

Figure 7A:
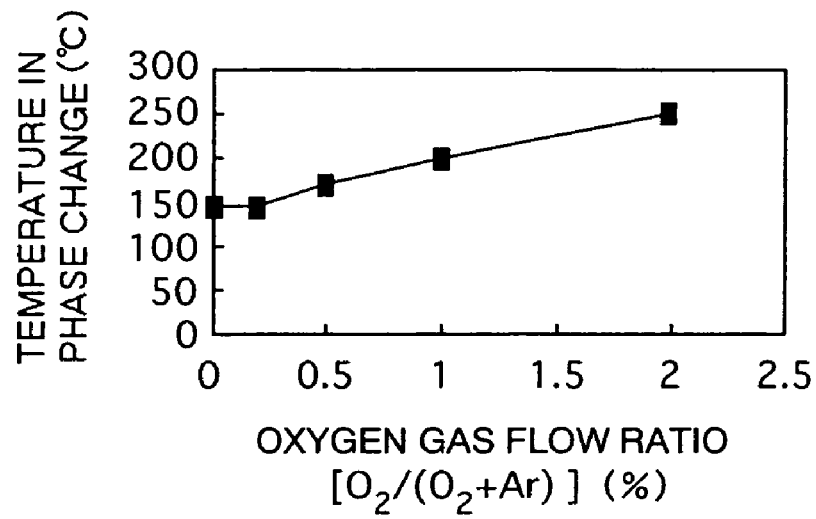
FIG. 7A is a graph showing the relationship between a mixed flow rate ratio of oxygen gas added to a sputtering argon gas upon formation of a GST film according to the invention and a phase change temperature of the obtained film.
Figure 7B:
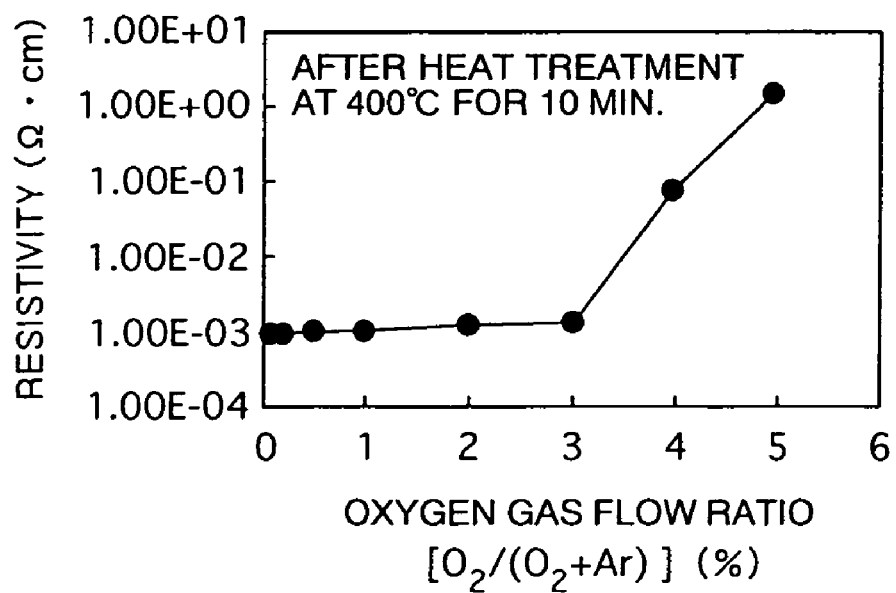
FIG. 7B is a graph showing the relationship between a mixed flow rate ratio of oxygen gas added to a sputtering argon gas upon formation of a GST film according to the invention and a resistivity of the obtained film further subjected to a heat treatment at 400° C.

FIGS. 7A and 7B show the relations between the oxygen gas mixed flow rate ratio, and the resistivity and the phase change temperature of the GST film subjected to a heat treatment in a nitrogen atmosphere at 400° C. for 10 min. FIG. 7A is a graph showing the relationship between the flow rate ratio of the addition oxygen gas during formation of the GST film and the phase change temperature of the GST film. The abscissa represents the flow rate ratio of the addition oxygen gas and the ordinate represents the phase change temperature. FIG. 7B is a graph showing the relationship between the addition nitrogen gas flow rate ratio upon formation of the GST film and the resistivity of the GST film after the heat treatment at 400° C. for 10 min. The abscissa represents the addition nitrogen gas flow rate ratio and the ordinate represents the resistivity. As apparent from both of the graphs, the dependency of the resistivity on the oxygen gas mixed flow rate ratio showed no distinct dependency as in the nitrogen gas mixture shown for the previous example in FIGS. 5A and 5B. That is, as far as the oxygen gas mixed flow rate ratio of 4% or less, the resistivity merely increased to about twice of 0.6 mΩ·cm of the GST film formed only with the argon gas. The resistivity increased abruptly at 4% or more. Then, X-ray diffractiometry was conducted for studying the dependency. Up to 3%, the dependency was substantially the same as that in the standard GST film formed only with the argon gas, the hcp crystal structure of $Ge_2Sb_2Te_5$ was shown, and the crystal grain size determined based on the diffraction peaks after the heat treatment at 400° C. was 90 nm to 120 nm, which was about the same as that of the standard GST film. However, as the flow rate ratio increased to 4%, the hcp crystal structure of $Ge_2Sb_2Te_5$ was not formed and only the crystals of $Sb_2Te_3$ were grown. Then at 5%, neither $Sb_2Te_3$ crystals were grown but tellurium crystals were grown. The result shows that the condition for the oxygen gas mixed flow rate ratio applicable to the phase change memory is 4% or less. In a range from 2% to 4% or less, ultrafine deposits were sometimes grown on the film surface by the thermal step for the manufacture of the semiconductor integrated circuit device. Accordingly, in a case of restricting the range further, it can be said that the mixing ratio of 2% or less is more preferred for the formation of the GST film of the phase change memory.

On the other hand, the phase change temperature showed a remarkable increase in the temperature along with the oxygen gas mixed flow rate ratio. The temperature increase was not so remarkable up to 0.2% but began to show an abrupt change at 0.5%. Then, at 1%, it was increased up to 210° C., which is higher by 50° C. than the phase change temperature of 150° C. of the standard GST film. At 3%, it reached about 260° C. As described above, it was found that while the phase change temperature depends on the oxygen gas mixed flow rate ratio, the resistivity and the crystal structure formed by the heat treatment scarcely changed up to 4% or less. The resistivity was measured by using a 4-probe resistance measuring instrument. To study the phenomenon in which the dependency on the addition oxygen gas flow rate ratio is different between the phase change temperature and the resistivity, XAFS and XPS were conducted using the high energy emission light instrument in the same manner as in the experiment for the nitrogen gas mixed flow rate ratio. Further, observation for the crystal grains of the GST film by a transmission electron microscope (TEM) and measurement for the distribution mapping in the plane of oxygen element by electron energy loss spectroscopy (EELLS) and TEM-energy dispersion fluorescence X-ray spectroscopy (EDX). The evaluation by EELLS and EDX showed that the amount of oxygen segregated in the crystal grain boundary was more than the amount of oxygen present within the grain in the range of the oxygen gas mixed flow rate ratio from 0.05% to 4% or less. This can be said to be a significant difference compared with the case of the experiment for the study of the nitrogen mixed flow rate ratio in which nitrogen was present in a great amount also in the grains together as on the grain boundary. Further, the result of simulation analysis for the crystal structure using the result of XAFS measurement revealed that the oxygen present in the grain was present in a state of substituting the Te position of the $Ge_2Sb_2Te_5$ crystal structure. Then, it is probable that at an oxygen gas mixed flow rate ratio of 4% or less, up to about 30% of tellurium contained in the film is substituted. As described previously, precipitates were observed on the film surface within a range of the oxygen gas mixed flow rate ratio from 2% to 4% or less. The position for Te in the $Ge_2Sb_3Te_5$ crystal structure was occupied by oxygen substitution and driven out tellurium was precipitated. Further, germanium oxide was formed at the grain boundary and Sb and Te became excessive in the GST film having the $Ge_2Sb_2Te_5$ composition upon film formation and the elements were precipitated. When the oxygen gas mixed flow rate ratio reached 4%, the amount of germanium bonded with oxygen and consumed as the oxide reached 50%. In a case where such a great amount of germanium is consumed, antimony and tellurium become more stably in view of energy in a state of forming antimony telluride crystals or precipitated tellurium crystals such as $Sb_2Te_3$ than in the state of forming $Ge_2Ab_2Tb_5$ crystals.

Unlike nitrogen, oxygen belongs to the same chalcogenide group as tellurium. Accordingly, in a case where the mixed gas is oxygen, oxygen can substitute the position for tellurium so long as it is within a certain amount without disturbing the structure of $Ge_2Sb_2Te_5$ crystal. It is probable that this is the reason why the crystal structure and the resistivity do not change so much up to an oxygen gas mixed flow rate ratio of 4% or less. It is probable that the allowable limit is about 30% for the tellurium positions in the entire GST crystals.

Based on the result of the study described above, a semiconductor integrated circuit device mounting the phase change memory using the GST film formed with an oxygen gas mixed flow rate ratio of 2% or less was manufactured. The rewriting current of the phase change memory using the GST film formed at a gas flow rate ratio of 1% was 70 μA under the same pulse condition as in Example 1. Although the resistivity of the GST film was substantially unchanged from that of the GST film formed by using only the argon gas, rewriting could be conducted at a current lower by more than one digit compared with the case of using the same. The reason was found to be due to the presence of a germanium oxide layer formed on the plug boundary based on element mapping analysis by cross sectional TEM observation for the device and EDX analysis using TEM. The thickness of the oxide layer was within a range from 0.5 nm to 3 nm. The phase change temperature was about 210° C.

When the oxygen gas mixed flow rate ratio increased up to about 3%, the yield tended to lower due to bit depletion or the like in connection with the formation of precipitates.

EXAMPLE 5

In Example 5, the concentration of germanium oxide near the plug surface was made higher by forming the GST film divisionally in two stages in the same manner as in Example 2. The first GST film was deposited to 5 nm at an oxygen gas mixed flow rate ratio of 3% and then a second GST film of 95 nm thickness was formed at a gas mixed flow rate ratio of 0.2%. As described above, by adopting the multi-layered GST film, it was possible to manufacture an integrated circuit device mounting a phase change memory capable of suppressing the formation of precipitates and controlling the rewriting current to a level slightly lower than that in Example 4.

EXAMPLE 6

In Example 6, in forming the metal plug 18 shown in FIG. 1, after deposition of a titanium nitride barrier 16, tungsten 17 and tungsten silicide in the hole, the excess metal film at the flat portion other than the hole portion was removed by a CMP method. Thus, the material on the plug surface was formed of tungsten silicide (titanium nitride was present in a ring-shape on the side wall region of the opening at the periphery of tungsten silicide). A GST film of the same 2-layered structure as in Example 5 was formed on the surface to manufacture a semiconductor integrated circuit device mounting the phase change memory.

In this example, oxygen of the germanium oxide in the GST film is deprived by silicon of silicide and silicon oxide is formed in a self alignment manner on the surface of the silicide of the plug in the course of a heat treatment at 300° C. or higher concerning the manufacture of the semiconductor integrated circuit device. Then, the extremely thin silicon oxide layer acts as a heater layer to succeed in decreasing the rewriting current of the phase change memory to 50 µA, which was further lower than that in Example 5.

In Examples 4 to 6, oxygen was used as a gas to be mixed with the argon gas. Any gas may be used so long as it is an oxidative gas and the same effect can also be obtained by using a nitrogen oxide gas, moisture or carbon oxide gas described previously. Needless to say, it is important to control the rate of mixing the gas in the argon gas stream is important so that the amount of germanium constituting the GST film consumed in the formation of the oxide, and the oxygen substitution ratio at the positions for tellurium in $Ge_2Sb_2Te_5$ crystal can be restricted to the range described above.

EXAMPLE 7

In Example 7, the effect was studied of increasing the phase change temperature by forming the carbon compound in the GST film and of suppressing the rewriting current of the phase change memory by the increase of the resistance like in the case of the nitrogen compound and the oxygen compound described previously.

Generally, carbon compounds are most stable thermo dynamically among the light elements and metal compounds and they are high resistance. Accordingly, carbon also has the same effect as nitrogen and oxygen. As the gas to be mixed with the argon gas, CO or carbonaceous gas such as $CO_2$, or organic gas can be used. In this example, easily handleable $CO_2$ gas was used. The case of carbon shows the same trend as that of nitrogen described above and since gaseous carbon dioxide is used, the case of carbon also shows a similar state to the case of mixing the oxygen gas. However, since the carbon compound is stable, precipitates such as of an antimony telluride compound or tellurium were not formed up to about a 5%-gas flow rate ratio of a gaseous carbon dioxide to be mixed with the argon gas. In a case of $CO_2$, since the effect of oxygen may also be probable, the same study was conducted by using an ethane gas. Its result also showed the same increase in the phase change temperature and the same crystallization characteristic such as crystal grain size as those described for the film with the ethane gas mixed flow rate ratio of up to about 5% relative to the argon gas or with the nitrogen gas mixed flow rate ratio of up to about 3%. The dependency of the resistance of the film was greater than the dependency of the nitrogen gas mixed flow rate ratio.

In addition, also the structure described in examples regarding nitrogen gas mixing and oxygen gas mixing was studied by using gases relevant to carbon. That is, studies were conducted also of the GST film 2-layered structure and carburization of the plug boundary metal, and substantially the same effects were confirmed.

EXAMPLE 8

This example shows an example of doping ions such as nitrogen, oxygen or carbon to a desired position in the film by an ion implantation method after the GST film has been formed.

In the previous examples, description has been made to methods of mixing a nitrogen, oxygen or carbon dioxide gas into the argon gas upon formation of the GST film and forming compounds of the elements and germanium, etc. or substituting tellurium in $Ge_2Sb_2Te_5$ crystals by the thermal process conducted through the manufacturing step for the semiconductor integrated circuit device, and the effect obtained as the result thereof. In this example, a GST film is formed once by using only the argon gas and then doping ions of nitrogen, oxygen, or carbon to a desired film depth or to desired specific positions in the plane by an ion implantation method.

Figure 8:
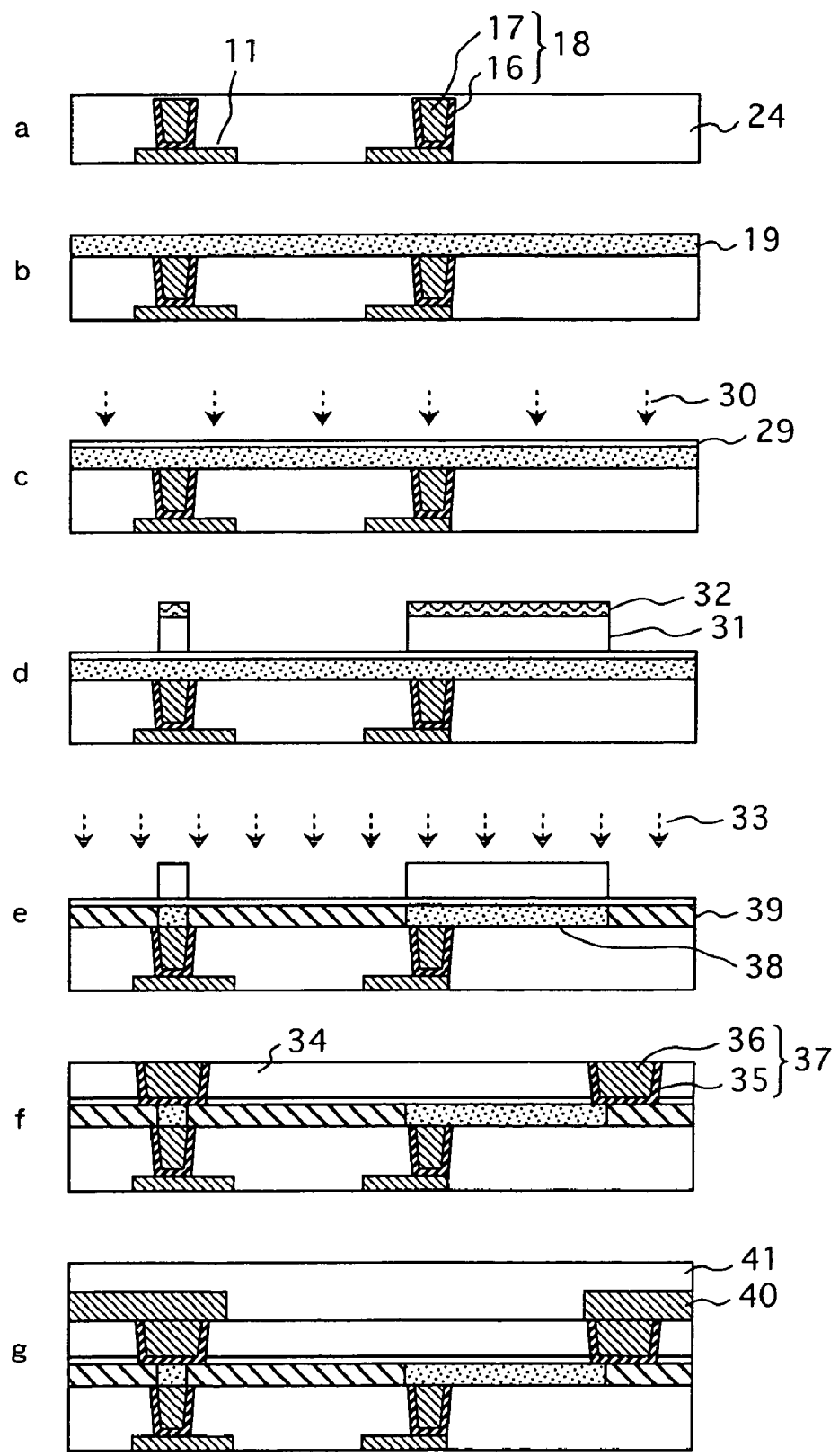
FIG. 8 is a cross-sectional view of a phase change memory device of the invention in the order of manufacturing steps thereof.

The same effect as in each of the examples was obtained by selecting the implantation energy for each ion, conducting doping in the GST film at or near the boundary of the plug and by way of the thermal process for the manufacture of the semiconductor integrated circuit. In this example, description is to be made with reference to FIG. 8 on the application example of a doping method by ion implantation not obtainable in each of the examples described above. FIG. 8 is a cross sectional view showing a semiconductor device of this example in the order of manufacturing steps.

The process up to the step of forming the tungsten plug 18 is identical with the steps in FIG. 1 (FIG. 8A). Then, a standard GST film 29 of 100 nm thickness was formed at a room temperature (FIG. 8B) using only an argon gun. Then, a PTEOS film 29 was formed to 5 nm thickness (FIG. 8C). Successively, nitrogen ions 30 were implanted through the PTEOS film at 10 KeV by a dose amount of $5\times10^{14}/cm^2$. Then, a PTEOS film 31 was further deposited to 100 nm to fabricate PTEOS into a desired shape using a photoresist 32 as a mask by a usual lithographic technique and PTEOS dry etching technique to fabricate PTEOS into a desired shape (FIG. 8D).

Then, oxygen ions 33 were implanted at a dose amount of $2\times10^{16}/cm^2$ using the fabricated PTEOS film 31 as a mask (FIG. 8E).

Successively, after the resist has been removed by using a usual ashing technique or the like, the extreme surface of PTEOS stained by the ion implantation step was removed by an etching solution of hydrofluoric acid/water (=1/500). Then, a PTEOS film 34 was formed again. Then, unevenness on the PTEOS surface was planarized by removing the unevenness on the PTEOS by using a CMP technique. Successively, openings were formed at desired regions of the PTEOS film by using a lithographic technique and a dry etching technique, then a 10 nm-thick titanium nitride barrier 35 was formed, and a tungsten film 36 was formed thereon. Then, the films other than the openings were removed by using the CMP technique to form a metal plug 37 (FIG. 8F).

Subsequently, a 0.5 µm-thick aluminum interconnection 40 and, further, an interlayer insulative layer 41 were formed (FIG. 8G). For the subsequent process forming multi-layered interconnections, usual process used for forming the multi-layered interconnection of semiconductor integrated circuit devices was applied.

According to this example, the region in which nitrogen ions 38 at a low concentration were implanted showed substantially the same characteristics as those of the GST film for use in the phase change memory identical with the examples described above. On the other hand, the region implanted with the oxygen ions 39 at a high concentration showed almost an insulated property. Accordingly, as shown in the drawing, the channel of current for rewriting or signal transmission is restricted in the ion implantation region at low concentration.

It is difficult to finely fabricate the chalcogenide film such as a GST film by dry etching. Accordingly, it was difficult to form a fine phase change memory device of 0.1 µm or less. However, it is not necessary in this example to fabricate the chalcogenide film. Then, it requires only the fabrication technique for PTEOS, etc., for which refining fabrication is applicable easily.

Figure 9:
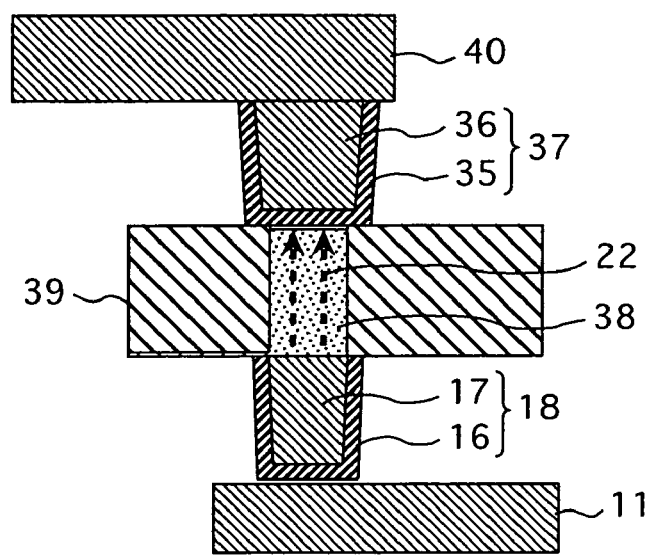
FIG. 9 is a cross-sectional view of a main portion of a phase change memory device shown in FIG. 8.

This example is different from the examples described above. Specifically, the opening diameter of the metal plug below the chalcogenide film was made fine up to 0.12 µm and the diameter for the ion implantation region 38 at a low nitrogen concentration on the plug was defined as 0.7 µm. Then, the diameter for the metal plug electrode 37 disposed over the region 38 was defined as 0.12 µm. FIG. 9 shows a partially enlarged cross sectional view of this state. Also in FIG. 9, only electrical main constituent members are shown. Over the first interconnection 11 is mounted the second plug 18 and the chalcogenide films 38, 39 are mounted successively thereover. Further, over the chalcogenide film are mounted a third plug 37 and a second layer interconnection 40 successively thereover. For the first and the second plug, tungsten films 17, 35 are formed respectively, and a titanium nitride barrier film is disposed covering the lateral side and the lower surface of the tungsten film. Further, the chalcogenide film comprises an ion implanted region 38 at a low concentration and an ion implanted region 39 at a high concentration. Current in the chalcogenide film of this structure is shown by reference numeral 22. Diversion of the current as in the existent film is not observed.

In the previous examples, development for the dry etching technique for forming a fine chalcogenide pattern was necessary. However, in this example, a phase change memory that can be mounted on the semiconductor integrated circuit device after the generation of 0.1 µm technology could be attained without development of such special technique. In this example, since the region causing the phase change is limited to a region above the plug, the inter-bit distance of the memory can be made closer than each of the examples described above and density of the semiconductor integrated circuit can be increased.

Figure 10:
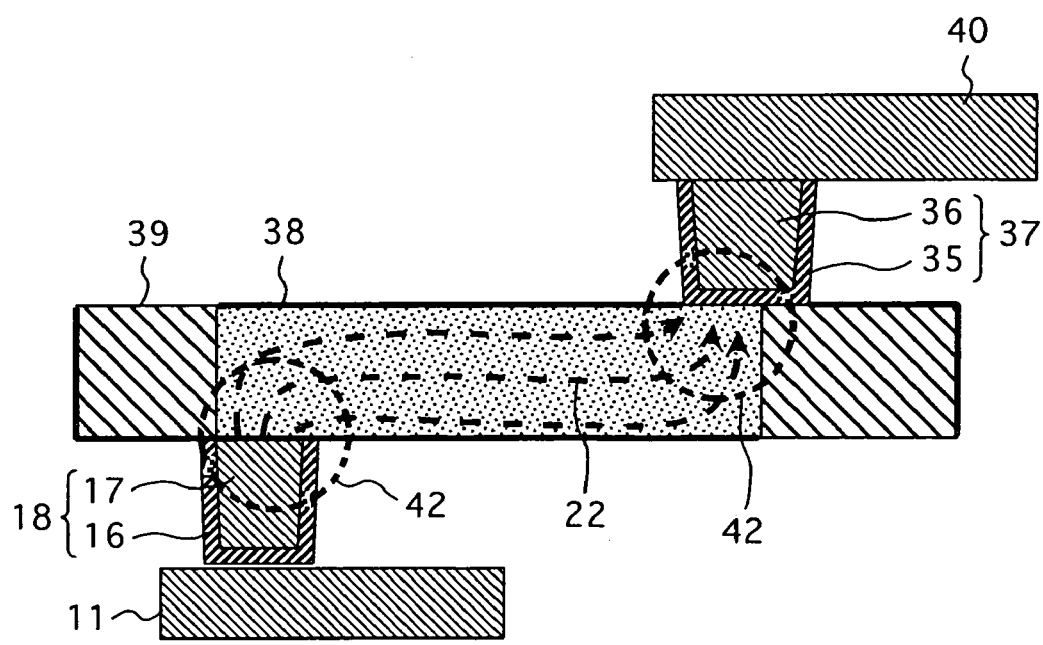
FIG. 10 is a cross-sectional view for explaining an interconnection having a memory performance in which a GST film is applied to the interconnection that is exemplified in Example 8.

Further, a phase change device interconnection can be formed as shown in FIG. 10. Also in FIG. 10, only main electrical constituent members are shown. Over the first interconnection 11, is mounted a second plug 18, and chalcogenide films (38, 39) are mounted over the second plug 18. Further, over the chalcogenide film, a third plug 37 is formed and a second layer interconnection 40 is formed over the third plug. The first and the second plug are provided with tungsten films 17, 35, respectively and a titanium nitride barrier film is disposed covering the lateral side and the lower surface of the tungsten film. Further, the chalcogenide film comprises two regions, that is, an ion implantation region 38 at a low concentration and an ion implantation region 39 at a high concentration. Then, this example is different from the Example in FIG. 9. Specifically, the ion implantation region 38 at the low concentration that can form current channel is extended in the traverse direction along the surface of the substrate. Thus, the chalcogenide film can also be used as an interconnection. The current in the chalcogenide film of this structure is represented by reference numeral 22. A portion show by reference numeral 42 is a high current density region (so-called information rewritable region) in the phase change memory interconnection.

By using the phase change memory interconnection, a plurality of semiconductor integrated circuits formed in a chip can be optionally wired or disconnected. In addition, they can be conducted at a high speed of several tens nsec. Thus, users can realize a semiconductor circuit device compound system suitable for their purpose.

This example is applicable as a fuse for DRAM. While a large area and opening were required in the existent fuse due to weld disconnection, it requires only a region of about 0.1 µm, and opening or like other unnecessary portion is not required at all in this example. Further while a usual fuse could not be recovered once after disconnection, this example has a advantage capable of resuming the original state again and again.

In the examples described above, compounds comprising germanium, antimony, and tellurium were used as the chalcogenide film. While various materials are applicable to the phase change memory of the semiconductor integrated circuit device, they are particularly preferably selected from the materials used for DVD. While zinc, silver, indium, nickel, sulfur or selenium may sometimes be added to GST, it is considered that Zn has a particularly high practical usefulness. Also in this case, formation of compounds with oxygen, nitrogen, and carbon has an effect of increasing the phase change temperature and the resistivity of the film like that of germanium.

According to the structure analysis using XAFS, zinc has a high possibility of occupying the position for germanium or antimony in the GST crystal structure and this has an effect of increasing the phase change temperature and the resistance of the film. Accordingly, in a case of adding zinc, the amount of germanium for forming the nitride, oxide, or carbide may be decreased compared with each of the examples described above. Further, since also zinc, like germanium, tends to form nitride, oxide, or carbide, the phase change temperature and resistivity of the film can be increased by forming a portion of incorporated zinc into the compounds.

In the examples described above, the concentration of germanium and antimony in the GST film near the boundary of the plug electrode increases more than that in other regions in a self-alignment manner in a case of forming the oxide and the carbide near the plug boundary and the concentration of tellurium can be decreased accordingly. The thus formed concentration distribution has an effect of increasing the film resistance near the plug and increasing the phase change temperature.

Figure 11:
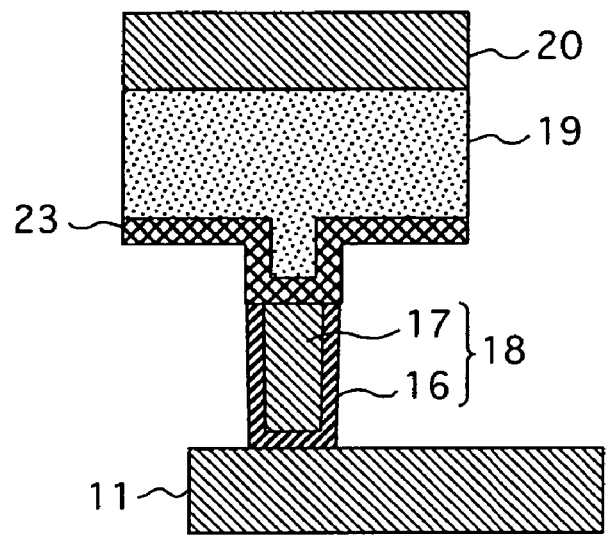
FIG. 11 is a cross-sectional view of a main portion of a phase change memory device by way of example according to the invention in which a portion of a chalcogenide film is buried in the opening of a plug electrode, and an oxide, nitride, or carbide comprising chalcogenide constituent elements of the chalcogenide film is segregated or the concentration of the compound is increased in the film near the underlayer.
Figure 12:
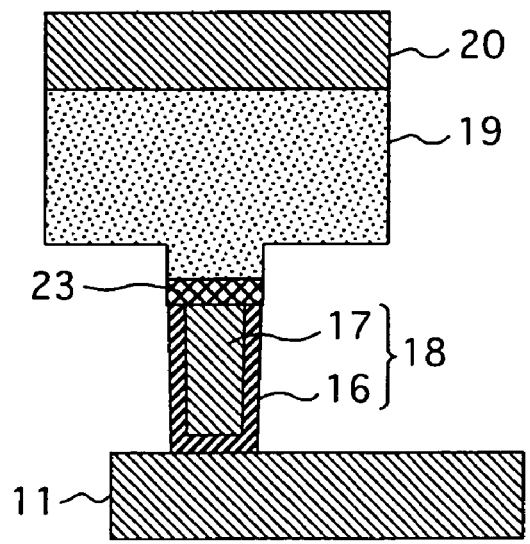
FIG. 12 is a cross-sectional view of a main portion of a phase change memory device by way of example according to the invention in which a portion of a chalcogenide film is buried in the opening of a plug electrode, and an oxide, nitride, or carbide comprising the chalcogenide constituent elements is segregated or the concentration of the compound is increased at the boundary of the plug electrode.

While the chalcogenide layer and the underlayer were flat in the examples described above, the purpose of the invention could be attained also by an embodiment where a portion of the chalcogenide film 19 is extended into the plug opening (refer to FIG. 11) or an embodiment in which the oxide, nitride, or carbide 23 is formed in the inside or at the boundary of the chalcogenide film in the vicinity in contact with the plug electrode 18 in the opening (refer to FIG. 12). In particular, in this structure, since the diversion of electric current can be more suppressed during current supply compared with the example of using the planarized chalcogenide film, it has an effect of further increasing the current density near the plug. Accordingly, the rewriting current can be decreased by about 5% than that in each of the examples described previously. Each of the portions of FIG. 11 and FIG. 12 carries the same reference numerals as those described above.

Figure 13:
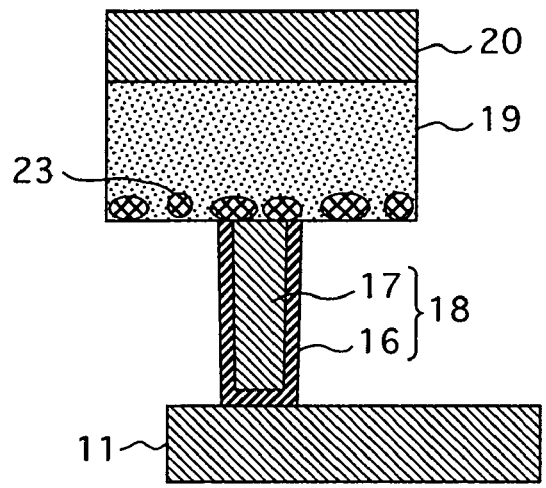
FIG. 13 is a cross-sectional view of a main portion of a phase change memory device, by way of example, in which an oxide, nitride, or carbide comprising chalcogenide constituent elements formed near or on the boundary of the plug electrode is not formed as a continuous layer but as a discontinuous layer of an island-shape or a layer apertured with a number of pores.

In the examples described above, the oxide, nitride, or carbide formed on or near the boundary was made continuous. However, as shown in FIG. 13, it is possible to provide a portion where the chalcogenide is in direct contact on the plug surface not by way of the compounds, by providing the compound in a discontinuous island shape or in a shape where a plurality of pores are apertured in the compound layer. Since a current preferentially flows to an extremely small direct contact portion in such a state, rewriting of the phase change memory device could be conducted by a more minute current. In a case of applying this structure to each of the examples described above, it was confirmed that rewriting current could be decreased within a range from 5% to 10%. Such a discontinuous compound could be obtained by forming unevenness (which may be moderate) on the surface of the underlying plug electrode and then applying the example described above. Alternatively, it could also be obtained by forming a compound of a thickness from 1 nm to 10 nm separately by a sputtering method and then forming the chalcogenide film. In this case, formation of the island-shape could be accelerated by subjecting to annealing at a temperature in a range from 300° C. to 700° C. after the compound has been formed.

In each of the examples, while description has been made mainly for the addition of nitrogen, oxygen, or carbon each alone, it will be apparent that the effect of the invention can also be obtained by adding two or all of the elements simultaneously. In these cases, when each of the elements is incorporated together to such a range as capable of incorporating the element each alone, voids, swelling or precipitation of tellurium or tellurium compound described previously becomes remarkable. Naturally, it is important to control the amount of germanium, antimony or zinc consumed by the additive elements in the thermal step for the manufacture the semiconductor device at least to a range of less than 50% of the elements present before annealing.

Description for reference numerals used in the specification is as follows:

1 . . . silicon single crystal substrate (wafer),
2 . . . device isolation region,
3 . . . MOS transistor formed on a main surface of a substrate,
4 . . . source of the transistor formed on the main surface of the substrate,
5 . . . drain of the transistor formed on the main surface of the substrate,
6 . . . gate insulator film of the transistor formed on the main surface of the substrate,
7 . . . gate electrode of the transistor formed on the main surface of the substrate,
8 . . . nitride film on the side wall of the gate electrode transistor formed to the main surface of the substrate,
9 . . . cobalt silicide formed in a self-alignment manner on the surface of source, drain, and gate electrode of the transistor formed on the main surface of the substrate,
10 . . . first silicon oxide inter-layer insulative film formed to the transistor on substrate main surface,
11 . . . first interconnection layer,
12 . . . silicon nitride layer,
13 . . . titanium nitride barrier,
14 . . . tungsten film,
15 . . . first metal plug comprising a stack of titanium nitride and the tungsten film,
16 . . . titanium nitride barrier film formed in a second opening disposed over the first metal interconnection,
17 . . . tungsten film formed in a second opening disposed over the first metal interconnection,
18 . . . second metal plug,
19 . . . chalcogenide film,
20 . . . upper electrode of a phase change memory device
21 . . . phase change memory device,
22 . . . current,
23 . . . oxide, nitride or carbide of germanium, zinc or antimony,
24 . . . second interlayer insulative film,
25 . . . silicon nitride film,
26 . . . PTEOS film for processing phase change device pattern,
27 . . . chalcogenide film formed with addition gas mixed flow rate ratio at a high concentration in Example 2,
28 . . . chalcogenide film formed with addition gas mixed flow rate ratio at a low concentration in Example 2,
29 . . . extremely thin PTEOS film for preventing contamination upon ion implantation,
30 . . . ions of nitrogen, oxygen or carbon for implantation at a low concentration,
31 . . . PTEOS film for ion implantation mask,
32 . . . photoresist,
33 . . . ions of nitrogen, oxygen or carbon for implantation at a high concentration,
34 . . . interlayer insulative film over the phase change memory,
35 . . . titanium nitride barrier film formed in a third opening disposed over the phase change memory,
36 . . . tungsten film formed in a third opening disposed over the phase change memory,
37 . . . third metal plug,
38 . . . low concentration ion implantation region in a chalcogenide film,
39 . . . high concentration ion implantation region in a chalcogenide film,
40 . . . second layer interconnection,
41 . . . interlayer insulator film
42 . . . high current density region in phase change memory interconnection in Example 8 (information rewritable region)

What is claimed is:

1. A memory device comprising:
a chalcogenide film including tellurium as a main ingredient and at least two members selected from the group consisting of germanium, antimony, and zinc; and
a first electrode layer and a second electrode layer providing a current channel in the chalcogenide film;
wherein the chalcogenide film undergoes a phase change between two states, including an amorphous state and a crystalline state; and
wherein the chalcogenide film comprises a chalcogenide compound layer including a material selected from the group consisting of carbonized germanium, carbonized antimony, and carbonized zinc.

2. A memory device according to claim 1, wherein the first electrode layer is a plug electrode.

3. A memory device comprising:
a chalcogenide film including tellurium as a main ingredient and at least two members selected from the group consisting of germanium, antimony, and zinc; and
a first electrode layer and a second electrode layer providing a current channel in the chalcogenide film, wherein the chalcogenide film undergoes a phase change between two states, including an amorphous state and a crystalline state, wherein the chalcogenide film comprises a chalcogenide compound layer including at least one of a material selected from the group consisting of azotized germanium, azotized antimony, azotized zinc, carbonized germanium, carbonized antimony, and carbonized zinc, and wherein said at least one material included in the chalcogenide compound layer is at a higher concentration at a boundary, or a portion near the boundary, between the chalcogenide film and the first electrode layer.

4. A semiconductor integrated circuit device comprising:
a semiconductor substrate;
a switching portion formed on the semiconductor substrate;
a first insulative layer including silicon; and
a memory portion electrically connected directly or indirectly with the switching portion;
wherein the memory portion includes:
a first conductor layer formed in a region where the first insulative layer is removed;
a chalcogenide film formed in contact with the first conductor layer, the chalcogenide film comprising tellurium as a main ingredient and at least two members selected from the group consisting of germanium, antimony, and zinc; and
a second conductor layer formed over the chalcogenide film;
wherein the chalcogenide film comprises a chalcogenide compound layer including a material selected from the group consisting of carbonized germanium, carbonized antimony, and carbonized zinc.

5. A semiconductor integrated circuit device comprising:
a semiconductor substrate;
a switching portion formed on the semiconductor substrate;
a first insulative layer including silicon; and
a memory portion electrically connected directly or indirectly with the switching portion,
wherein the memory portion includes:
a first conductor layer formed in a region where the first insulative layer is removed;
a chalcogenide film formed in contact with the first conductor layer, the chalcogenide film comprising tellurium as a main ingredient and at least two members selected from the group consisting of germanium, antimony, and zinc; and
a second conductor layer formed over the chalcogenide film,
wherein the chalcogenide film comprises a chalcogenide compound layer including at least one of a material selected from the group consisting of azotized germanium, azotized antimony, azotized zinc, carbonized germanium, carbonized antimony, and carbonized zinc, and
wherein the semiconductor integrated circuit device further comprises, over the semiconductor substrate:
a second insulative layer including silicon;
a region where the second insulative layer containing silicon is removed;
a third conductor layer formed in the region where the second insulative layer is removed, and electrically connected to the switching portion;
at least a third insulative layer formed over the second insulative layer; and a fourth conductor layer formed in a region where the third insulative layer is removed and formed in electrical contact with the chalcogenide layer.

6. A semiconductor integrated circuit device comprising:
a semiconductor substrate;
a switching portion formed on the semiconductor substrate;
a first insulative layer including silicon; and
a memory portion electrically connected directly or indirectly with the switching portion;
wherein the memory portion includes:
a first conductor layer formed in a region where the first insulative layer is removed;
a chalcogenide film formed in contact with the first conductor layer, the chalcogenide film comprising tellurium as a main ingredient and at least two members selected from the group consisting of germanium, antimony, and zinc; and
a second conductor layer formed over the chalcogenide film,
wherein the chalcogenide film comprises a chalcogenide compound layer including at least one of a material selected from the group consisting of azotized germanium, azotized antimony, azotized zinc, carbonized germanium, carbonized antimony, and carbonized zinc, and
wherein said at least one material included in the chalcogenide compound layer is at a higher concentration at a boundary, or a portion near the boundary, between the chalcogenide film and the first conductor layer.

7. A semiconductor integrated circuit device according to claim 4, wherein the chalcogenide film includes a polycrystal body having an assembly of crystal grains in which small crystal grains surround a periphery of coarse crystal grains.

8. A semiconductor integrated circuit device according to claim 5, wherein said at least one material included in the chalcogenide compound layer is at a higher concentration at a boundary, or a portion near the boundary, between the chalcogenide film and the first conductor layer.

9. A semiconductor integrated circuit device according to claim 5, wherein the first conductor layer has an impurity barrier layer on a side wall other than a lateral surface with which the chalcogenide compound layer is in electrical contact.

10. A semiconductor integrated circuit device according to claim 5,
wherein a portion of the chalcogenide film extends into the region where the first insulative film is removed, and
the first conductor layer and said portion of the chalcogenide film are in electrical contact with each other in the region where the first insulative film is removed.

11. A semiconductor integrated circuit device according to claim 5, wherein said at least one material included in the chalcogenide compound layer, which is disposed at a boundary, or a portion near the boundary, between the first conductor layer and the chalcogenide compound layer, is present in pores of the chalcogenide compound layer, said pores including at least one of surface pores and internal pores.

12. A semiconductor integrated circuit device according to claim 5, wherein portions where the first conductor layer and the second conductor layer contact the chalcogenide layer are spaced from one another along a main surface of the semiconductor substrate.

13. A memory device comprising:
a chalgogenide film including tellurium as a main ingredient and at least two members selected from the group consisting of germanium, antimony, and zinc; and a first electrode layer and a second electrode layer providing a current channel in the chalcogenide film;
wherein the chalcogenide film further includes at least one of oxide, nitride, and a material selected from the group consisting of carbonized germanium, carbonized antimony, and carbonized zinc,
wherein the chalcogenide film has a first region and a second region between the first region and the first electrode, and
wherein a concentration of said at least one of oxide, nitride and the material is higher in the second region than in the first region.

14. A memory device according to claim 3, wherein the first electrode layer is a plug electrode.

* * * * *